(12) United States Patent
Otsuka et al.

(10) Patent No.: US 11,155,093 B2
(45) Date of Patent: Oct. 26, 2021

(54) METHOD OF PRODUCING STRUCTURE, PROTECTIVE SUBSTRATE, AND METHOD OF PRODUCING PROTECTIVE SUBSTRATE

(71) Applicant: CANON KABUSHIKI KAISHA, Tokyo (JP)

(72) Inventors: Manabu Otsuka, Kawasaki (JP); Tamaki Sato, Kawasaki (JP); Tetsushi Ishikawa, Tokyo (JP); Yasuaki Tominaga, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 465 days.

(21) Appl. No.: 16/242,524

(22) Filed: Jan. 8, 2019

(65) Prior Publication Data

US 2019/0217617 A1 Jul. 18, 2019

(30) Foreign Application Priority Data

Jan. 16, 2018 (JP) .............................. JP2018-005089

(51) Int. Cl.
*B41J 2/16* (2006.01)
*B41J 2/14* (2006.01)
*G03F 7/16* (2006.01)

(52) U.S. Cl.
CPC .......... *B41J 2/1623* (2013.01); *B41J 2/14145* (2013.01); *B41J 2/1603* (2013.01); *B41J 2/164* (2013.01); *B41J 2/1626* (2013.01); *B41J 2/1628* (2013.01); *B41J 2/1629* (2013.01); *B41J 2/1631* (2013.01); *B41J 2/1639* (2013.01); *G03F 7/161* (2013.01)

(58) Field of Classification Search
CPC ...... B41J 2/1623; B41J 2/1626; B41J 2/1631; B41J 2/164; G03F 7/161
See application file for complete search history.

(56) References Cited

U.S. PATENT DOCUMENTS

| 3,984,244 | A | * | 10/1976 | Collier ..................... B23K 1/20 430/315 |
| 7,985,531 | B2 | | 7/2011 | Kanri et al. |
| 9,919,526 | B2 | | 3/2018 | Asai et al. |
| 2005/0270332 | A1 | * | 12/2005 | Strand ................... B41J 2/1645 347/47 |

(Continued)

FOREIGN PATENT DOCUMENTS

| JP | 2015-104876 A | 6/2015 |
| JP | 2016-018838 A | 2/2016 |

*Primary Examiner* — John A McPherson
(74) *Attorney, Agent, or Firm* — Venable LLP

(57) ABSTRACT

A method of producing a structure having a through substrate includes: forming a protective member having an atmosphere communication layer having a structure communicating with the through hole by permeation from at least a part of a layer side surface part to the through hole, and a gas-impermeable protective layer in this order, on the second surface of the through substrate; forming a dry film resist layer having a resin layer and a support member in this order, on the first surface of the through substrate; and peeling the support member from the resin layer, the support member being peeled from the resin layer in a state that the through hole of the through substrate is communicated with atmosphere by at least the atmosphere communication layer, in the peeling.

15 Claims, 13 Drawing Sheets

(56) References Cited

U.S. PATENT DOCUMENTS

2017/0036447 A1* 2/2017 Ishikawa .............. B65B 31/028
2018/0154637 A1 6/2018 Asai et al.
2019/0077156 A1* 3/2019 Yamamuro ............ B41J 2/1606

* cited by examiner

METHOD OF PRODUCING STRUCTURE, PROTECTIVE SUBSTRATE, AND METHOD OF PRODUCING PROTECTIVE SUBSTRATE

BACKGROUND OF THE INVENTION

Field of the Invention

The present invention relates to a method of producing a structure, a protective substrate, and a method of producing a protective substrate.

Description of the Related Art

In recent years, device preparation using both surfaces of a substrate has been performed by applying, for example, film formation, shape processing of an uneven shape, a fine shape or the like, and processing to impart functionality of forming an energy generating element or the like, on a front surface of a substrate, and by similarly applying, for example, processing to impart some kind of functionality also on the back surface. In performing the double-sided processing of a substrate, first, a step of forming a film, an uneven shape, an energy generating element and the like on a front surface of a substrate is performed, and then a step of protecting these products formed on the front surface of the substrate are performed. Specifically, film formation of a protective film, temporary bonding of a protective member, sticking of a protective tape, and the like are performed on the front surface of the substrate. Subsequently, a step of processing the back surface of the substrate is performed on the substrate (protective substrate) of which the front surface has been protected.

As a device in which both surfaces of a substrate are processed, for example, a liquid ejection head used in a liquid ejection recording device (for example, an ink jet recording apparatus) that performs recording by ejecting a recording liquid such as ink, and the like can be mentioned. This kind of liquid ejection head has a nozzle layer having an ejection orifice for ejecting a liquid and a flow path for communicating with the ejection orifice, and an element substrate having an energy generating element for generating energy for ejecting a liquid and a liquid supply port for supplying a liquid to the flow path. In this liquid ejection head, a liquid supplied from the outside of an element substrate is supplied to a nozzle layer via a liquid supply port, and therefore, as the supplying method of a liquid, a method of supplying a liquid from a liquid supply port that is arranged so as to penetrate an element substrate from a back surface of the element substrate is known.

In Japanese Patent Application Laid-Open No. 2016-018838, a method in which processing on a back surface side is performed by performing deep digging to have a scallop shape in a silicon substrate by plasma etching, and then sticking a protective tape has been disclosed. By sticking a protective tape on a front surface of a substrate, the substrate can be processed without giving any influence on the front surface of the substrate during processing of the back surface.

In Japanese Patent Application Laid-Open No. 2015-104876, a liquid ejection head that is provided with high-density ejection orifices, flow paths, and liquid supply ports prepared by processing both surfaces of a substrate has been disclosed. In addition, in Japanese Patent Application Laid-Open No. 2015-104876, the above-described nozzle layer and the like are prepared by using a photosensitive dry film resist.

SUMMARY OF THE INVENTION

Although there is partially described also in Japanese Patent Application Laid-Open No. 2016-018838 and Japanese Patent Application Laid-Open No. 2015-104876, when processing both surfaces of a substrate (through substrate) to which a through hole penetrating the substrate is provided, after processing one surface, the one surface is required to be protected with a protective member. However, in a case of using a dry film resist (hereinafter, sometimes also referred to as DFR) supported by a support member for the processing of the other surface, there has been a case where the DFR provided on a substrate is deformed when the support member is peeled off. This is presumed because the pressure in a through hole part sealed with the DFR and the protective member fluctuates.

In addition, for example, when exposing the DFR by using a photosensitive resin for the DFR, an operation of sucking the non-processed surface side (for example, the protective member side) of the substrate to a device is performed. At this time, for example, even in a case where the entire protective member has gas permeability and the through hole part of the substrate and the suction part of the device communicate with each other, similarly, there has been a case where the DFR is deformed due to pressure fluctuation.

In this regard, although a technique for suppressing the deformation of the DFR has been disclosed in Japanese Patent Application Laid-Open No. 2015-104876, the present inventors have determined that further development of a technique for suppressing the deformation is necessary.

An object of the present invention is to hardly generate the pressure fluctuation of a through hole part of a through substrate, and to suppress the deformation of a DFR, during the peeling of a support member, the suction operation using a device, or the like, in a method of producing a structure having a through substrate in which a through hole is formed.

An aspect of the present technology relates to a method of producing a structure having a through substrate having a first surface and a second surface opposite to the first surface, and having a through hole penetrating the through substrate from the first surface to the second surface, and a resin layer placed on the first surface of the through substrate, the method including: forming a protective member having an atmosphere communication layer having a structure communicating with the through hole by permeation from at least a part of a layer side surface part to the through hole, and a gas-impermeable protective layer in this order, on the second surface of the through substrate; forming a dry film resist layer having a resin layer and a support member in this order, on the first surface of the through substrate; and peeling the support member from the resin layer, the support member being peeled from the resin layer in a state that the through hole of the through substrate is communicated with atmosphere by at least the atmosphere communication layer, in the peeling.

Another aspect of the present invention relates to a protective substrate, including: a through substrate having a first surface and a second surface opposite to the first surface, and having a through hole penetrating the through substrate from the first surface to the second surface; a dry film resist layer being placed on the first surface of the through substrate, and having a resin layer and a support member in this order on the first surface; and a protective member being placed on the second surface of the through substrate, the protective member having an atmosphere communication layer having a structure communicating with the through hole by permeation from at least a part of a layer side surface part to the through hole, and a gas-impermeable protective layer in this order, on the second surface, and the through hole of the through substrate being communicated with atmosphere by at least the atmosphere communication layer.

Still another aspect of the present invention relates to a method of producing a protective substrate having a through substrate having a first surface and a second surface opposite to the first surface, and having a through hole penetrating the through substrate from the first surface to the second surface; a dry film resist layer being placed on the first surface of the through substrate, and having a resin layer and a support member in this order on the first surface; and a protective member being placed on the second surface of the through substrate, and having an atmosphere communication layer having a structure communicating with the through hole by permeation from at least a part of a layer side surface part to the through hole, and a gas-impermeable protective layer in this order, on the second surface, the method including: forming the protective member on the second surface of the through substrate; and forming the dry film resist layer on the first surface of the through substrate, the protective member being formed on the second surface of the through substrate in an arrangement that the through hole of the through substrate is communicated with atmosphere by at least the atmosphere communication layer, in the forming of the protective member.

Further features of the present invention will become apparent from the following description of exemplary embodiments with reference to the attached drawings.

DESCRIPTION OF THE EMBODIMENTS

Figure 1A:
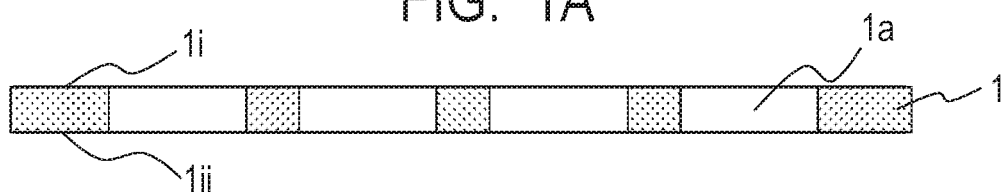
FIGS. 1A, 1B, 1C, 1D and 1E are schematic sectional views illustrating respective steps in one embodiment of the method of producing a structure according to the present invention.

Not only in a case where processing is performed on one surface (second surface) of a through substrate but also in a case where the processing is not particularly performed, a dry film resist (DFR) may be laminated on the other surface (first surface) of the through substrate. At this time, there has been a case where the following matters are generated. That is, there has been a case where at the time of lamination, the second surface of the through substrate comes into contact with a device or the like, scratches or chips are generated or foreign matters adheres on the second surface, and the yield is reduced. For this reason, in the present invention, prior to a step of forming a DFR, a protective member provided with an atmosphere communication layer having a specific structure and a gas-impermeable protective layer in this order on the second surface is formed (stuck). At this time, the protective member is placed on a through substrate so that a through hole of the through substrate is communicated with atmosphere via at least the atmosphere communication layer. In this regard, in the method of producing a structure according to the present invention, for the protective member, an atmosphere communication layer having a structure in which permeation is effected from at least a part of a layer side surface part to communicate with a through hole of the through substrate is used.

Accordingly, on the second surface of the through substrate, generation of scratches or chips, and adhesion of foreign matters can be prevented. The through substrate may be processed as necessary. Further, when the support member is peeled off, a through hole part of the through substrate is not sealed with a DFR and a protective member, the peeling of the support member of the DFR can be performed in a state that a space part in the through hole is open to the atmosphere, and thus the deformation of the DFR can be suppressed. In addition, since the protective member has a gas-impermeable protective layer, even when suction operation or the like by a device is performed, communication between the through hole part of the through substrate and an suction part of the device can be prevented, and the deformation of the DFR due to pressure fluctuation during the step can also be suppressed.

In this regard, in the method of producing a structure according to the present invention, the above-described method can be applied to the processing of both surfaces of a through substrate. That is, for example, the protective member of the present invention is stuck on one surface (second surface) of the through substrate on which processing such as forming of an energy generating element has been performed, and a resin layer is formed on the other surface (first surface) by using a DFR. Further, the resin layer is subjected to patterning or the like, and then the protective member is removed from this second surface. Subsequently, the protective member of the present invention is stuck on the first surface (specifically, the surface of the resin layer formed on the first surface) of the obtained through substrate, and a resin layer is formed by using a DFR on the second surface. In addition, the resin layer (formed on the second surface) is subjected to patterning or the like, and then the protective member stuck on the first surface is removed. With passing through such an operation, a structure having patterned resin layers (of which the deformation due to pressure fluctuation has been suppressed) on both surfaces of the through substrate can be easily produced.

Hereinafter, the embodiments of the present invention will be described in detail by making reference to drawings. However, the application range of the present invention is not limited to thereto. In this regard, each of FIGS. 1A to 1E are schematic sectional views illustrating respective steps of the method of producing a structure according to one embodiment of the present invention.

<Structure>

Figure 1B:
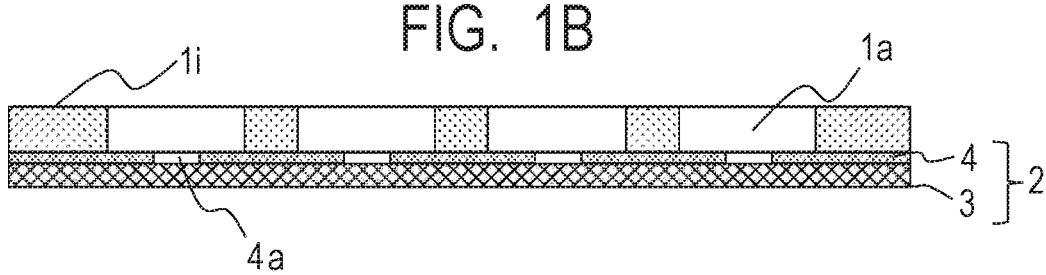
Figure 1C:
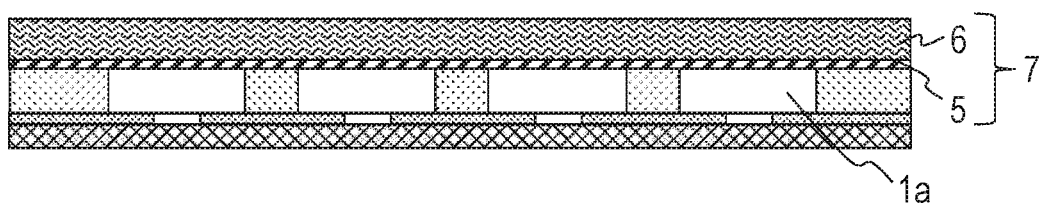
Figure 1D:
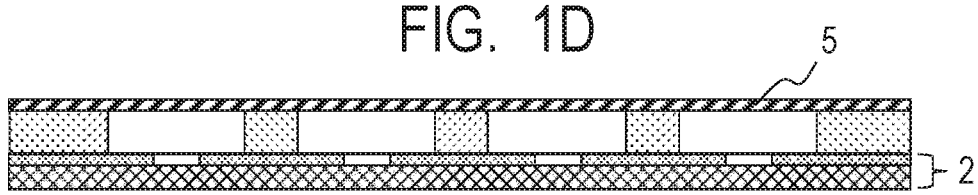
Figure 1E:
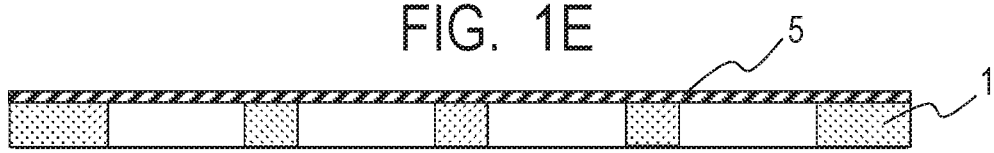

As shown in FIG. 1E, a structure produced according to the present embodiment has a through substrate 1, and a resin layer 5 placed on at least one surface of the through substrate 1. Further, as shown in FIG. 1A, the through substrate 1 has a first surface 1$i$, and a second surface 1$ii$ opposite to the first surface 1$i$, and further has a through hole 1$a$ penetrating the through substrate from the first surface 1$i$ to the second surface 1$ii$.

Figure 7:
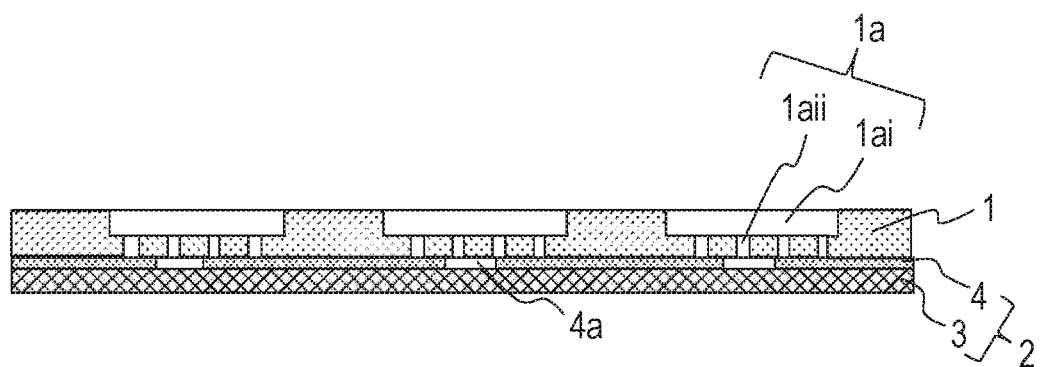
FIG. 7 is a schematic sectional view illustrating one example of a through substrate on which a protective member used in the method of producing a structure according to the present invention is placed.

In this regard, as shown in FIGS. 1A to 1E, the through substrate 1 can have one or multiple through holes 1$a$ each penetrating the through substrate with the same shape in a thickness direction (in the vertical direction on the drawing sheet) of the substrate. Herein, in FIG. 7, a schematic sectional view showing another example of the through substrate 1 (on which a protective member 2 is placed) is shown. As shown in this FIG. 7, in the through substrate 1, each through hole 1$a$ may be constituted of multiple penetration parts (for example, reference signs 1$ai$ and 1$aii$ in FIG. 7) in a thickness direction (or another direction such as a short direction of the substrate) of the substrate. As a result, it is sufficient that a hole communicating from the first surface to the second surface of the substrate is formed. Further, as shown in FIG. 7, with respect to the through hole 1$a$, the number of openings on the first surface and the number of openings on the second surface of the through substrate 1 may not be matched with each other, that is, may not have a one-to-one relationship. Accordingly, for example, the through hole 1$a$ may have a structure in which one opening is (or multiple openings are) formed on the first surface of the through substrate, and multiple openings are (or one opening is) formed on the second surface.

The thickness of a substrate used for a through substrate is not particularly limited, and may be appropriately set within the range that cracks or the like are not caused during the penetration processing and the processing is not hindered.

In addition, in a structure shown in FIG. 1E, a resin layer 5 is placed on a first surface 1$i$ of a through substrate 1. As described above, after the formation of a resin layer 5, the resin layer 5 formed on a through substrate may be subjected to processing such as patterning, and the structure may be a structure (for example, a liquid ejection head) that has a structure (for example, a patterned resin layer or the like) on both surfaces of the through substrate 1 having a through hole 1$a$. In this regard, a structure produced according to the present embodiment may have at least a part (for example, an atmosphere communication layer) of the protective member of the present invention on the second surface 1$ii$ of the through substrate 1.

<Method of Producing Structure>

The method of producing a structure according to the present embodiment includes the following steps.

A step of forming a protective member having an atmosphere communication layer having a structure in which permeation is effected from at least a part of a layer side surface part to communicate with a through hole of a through substrate, and a gas-impermeable protective layer in this order on a second surface of the through substrate (protective member forming step).

A step of forming a dry film resist layer having a resin layer and a support member in this order on a first surface of the through substrate (DFR layer forming step).

A step of peeling the support member from the resin layer (peeling step).

In the method of producing a structure according to the present embodiment, in the above-described peeling step, the support member is peeled from the resin layer in a state that the through hole of the through substrate is communicated with atmosphere by at least the atmosphere communication layer.

In addition, the method of producing a structure according to the present embodiment can also include the following steps.

A step of processing at least one surface of a substrate (processing treatment step).

A step of preparing a through substrate (through substrate preparation step).

A step of patterning the resin layer (patterning step).

A step of removing at least the protective layer of the protective member from the second surface of the through substrate (removal step).

Further, the above-described protective member forming step can also include the following steps.

A step of preparing the protective member (protective member preparation step).

A step of sticking the protective member onto the second surface of the through substrate (protective member sticking step).

Further, the above-described DFR layer forming step can also include the following steps.

A step of preparing a DFR (DFR preparation step).

A step of sticking the DFR onto the first surface of the through substrate (DFR layer sticking step).

The order of and the number of times of each of the steps included in the method of producing a structure according to the present embodiment are not particularly limited, and multiple steps may be performed in parallel.

In this regard, in the method of producing a structure according to the present embodiment, by performing each of the above steps multiple times, a resin layer by a DFR utilizing the protective member of the present invention can be formed on both surfaces of a first surface and a second surface of a through substrate. In a case where a resin layer is formed on a first surface of a through substrate by the above-described production method, and then further, a resin layer is formed on a second surface of the through substrate by the production method, in each of the above steps, it can be replaced as follows. That is, in each of the above steps, the first surface of the through substrate can be replaced with the second surface of the through substrate, and the second surface of the through substrate can be replaced with the (outer) surface of the resin layer formed on the first surface of the through substrate. Hereinafter, each of the steps will be described in detail.

(Processing Treatment Step)

Onto at least one surface (for example, a surface corresponding to a second surface $1ii$ of a through substrate) of a substrate used for a through substrate 1, for example, film formation, shape processing of an uneven shape, a fine shape or the like, and processing to impart functionality of forming an energy generating element or the like can be applied. As the processing method, it is not particularly limited, and for example, a method known in the field of liquid ejection head may be appropriately used. This processing treatment step may be performed as necessary before or after forming a through hole in a substrate.

(Through Substrate Preparation Step)

As shown in FIG. 1A, a substrate (through substrate 1) onto which a through hole $1a$ penetrating the substrate from a first surface $1i$ to a second surface $1ii$ is formed is prepared. The substrate used for the through substrate 1 is not particularly limited, and may be constituted of a material that is usually used and on which penetration processing can be performed, such as silicon, glass, sapphire or various metals. The method of forming a through hole $1a$ in a substrate is not particularly limited, and for example, a processing method that is usually used such as dry etching, wet etching, laser ablation, and sandblast can be appropriately used. At this time, in order to prevent damage during substrate processing, a protective film, a protective tape or the like may be formed in advance on the substrate. In this regard, in a case where a film or the like is formed on at least one surface (part where a through hole is to be formed) of a substrate by the above-described processing treatment, a through hole $1a$ penetrating the substrate and the film is formed.

(Protective Member Forming Step)

Next, as shown in FIG. 1B, on one surface (second surface $1ii$) of a through substrate 1, a protective member 2 having an atmosphere communication layer 4 having a specific structure, and a gas-impermeable protective layer 3 in this order is formed. In this regard, a protective member may be formed so that the protective member (specifically, an atmosphere communication layer) is in contact with the second surface of the through substrate. In addition, within the range of not impairing the effects of the present invention, one or multiple other layers (for example, a film or the like formed by the above-described processing treatment) may be provided between the through substrate 1 and the protective member 2. These other layers each have a structure in which permeation between the through hole $1a$ of a through substrate and the atmosphere communication layer 4 is not hindered.

As the specific method of forming a protective member on a through substrate, for example, the following method can be mentioned. In a case where an atmosphere communication layer 4 has an adhesive part using a pressure-sensitive adhesive or the like on the second surface side (on the front surface side of other layers in a case of having the above-described other layers) of a through substrate 1, at first, a protective member having the adhesive part is prepared (protective member preparation step). Subsequently, by bonding the adhesive part of the obtained protective member to the second surface, the protective member and the through substrate can be stuck (protective member sticking step).

On the other hand, in a case where the atmosphere communication layer 4 does not have an adhesive function, at first, a protective member not having an adhesive function is prepared (protective member preparation step), and then by separately bonding the protective member and the through substrate by lamination or the like, both can be stuck (protective member sticking step).

In this regard, an adhesive function may be imparted to another layer to be formed between the through substrate and the protective member, and the through substrate and the protective member can be bonded via this another layer.

At the time of sticking a protective member, the through substrate can have multiple through holes $1a$ as described above, however, from the viewpoint of further suppressing the deformation of a resin layer at the time of pressure fluctuation, it is preferred to arrange the protective member and the through substrate so that all of the through holes $1a$ are communicated with atmosphere via the protective member. At that time, for example, in a case where one through hole $1a$ is constituted of multiple penetration parts ($1ai$, $1aii$ and the like) as shown in FIG. 7, in other words, in a case where respective penetration parts are communicated (directly or indirectly) with each other to constitute (the same) one (through hole) space, whole these multiple penetration parts are interpreted as one through hole $1a$.

In this regard, when a through substrate having a through hole as shown in FIG. 7 is used, even if one of the openings of multiple penetration parts $1aii$ on the second surface side is communicated with atmosphere via a protective member (groove $4a$ in FIG. 7) in a through hole $1a$ constituting the same through hole space, the effects of the present invention can be obtained with the lapse of time. However, from the viewpoint of reliably being communicated with atmosphere in a shorter time, it is more preferred to arrange the protective member and the through substrate so that 10% or more of the (total) opening area of the second surface in a through hole $1a$ is communicated with the atmosphere outside via the protective member.

Figure 10:
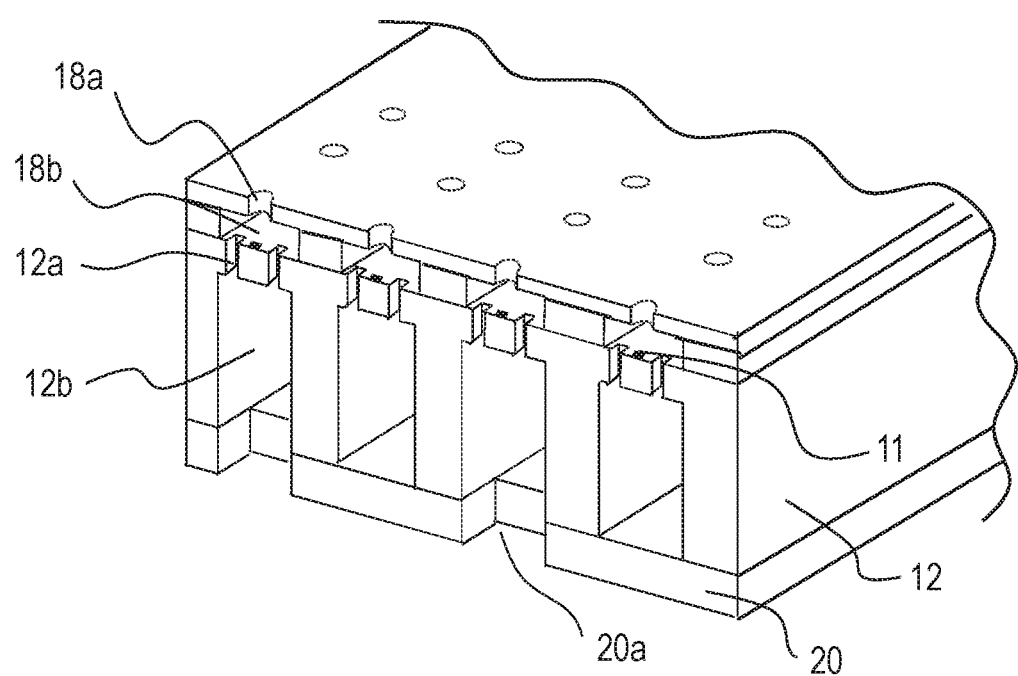
FIG. 10 is a schematic perspective view of one example of a liquid ejection head produced by using a method of producing a liquid ejection head of the present invention.

For example, when the through substrate shown in FIG. 7 or the liquid ejection head shown in FIG. 10 is taken as an example, the above-described description can be restated as follows. That is, it is preferred to arrange the protective member so that the through holes corresponding to 10% or more of the total opening area of the multiple through holes among the multiple through holes (for example, penetration parts $1aii$ or ejection orifices $18a$) constituting the same through hole space are at least communicated with atmosphere. In this regard, from the viewpoint of reliably being communicated with atmosphere in a shorter time, the proportion of the area that is communicated with atmosphere to the (total) opening area of the second surface in the through hole $1a$ is preferably as high as possible.

Further, in addition to the function of making a through hole communicate with atmosphere, from the viewpoint of stably sticking on and protecting a surface of a through substrate, it is preferred that a protective member is in contact with and fixed to 25% or more of the area (including the opening area of the through hole) of the second surface of the through substrate. Furthermore, it is more preferred that a protective member is in contact with and fixed to 50% or more of the area of the second surface of the through substrate. In this regard, the protective member can be in contact with and fixed to a part other than the opening part of the through hole on the second surface of the through substrate. Accordingly, from the viewpoint of fixing the protective member, the opening area (opening ratio) of the second surface of the through hole $1a$ is preferably less than 75% of the area (including the opening area of the through hole) of the second surface of the through substrate, and more preferably less than 50%.

Protective Member

Next, the protective member 2 will be described in detail.

The protective member 2 has at least an atmosphere communication layer 4, and a gas-impermeable protective layer 3 placed on a back surface (surface on the lower side of the drawing sheet shown in each of FIGS. 1A to 1E) of the atmosphere communication layer, and is placed so as to have the atmosphere communication layer 4 and the protective layer 3 in this order on a second surface 1ii of a through substrate. Therefore, within the range of not impairing the effects of the present invention, the protective member 2 may have one or multiple other layers between the atmosphere communication layer 4 and the protective layer 3, or on a back surface (surface on the lower side of the drawing sheet shown in each of FIGS. 1A to 1E) of the protective layer.

For example, between the atmosphere communication layer 4 and the protective layer 3, an intermediate layer such as a relaxation layer having a function of reducing the unevenness of the through substrate, and an adhesion layer for enhancing the adhesion between the atmosphere communication layer 4 and the protective layer 3, or the like may be formed.

Further, for example, a porous base material having gas permeability may be formed on a back surface of the protective layer.

In preparation of a structure (for example, a liquid ejection head), as the protective layer 3, it is not particularly limited, and various materials and constitutions can be used as long as they each have gas impermeability to such an extent that the deformation of the DFR is not caused while the through hole part of a through substrate and the suction part of a device communicate with each other during the suction operation, or the like using the device. From the viewpoint of further exerting the effects of the present invention, the gas impermeability that the protective layer has is preferably less than 0.0001 cm$^3$/cm$^2$·s. In this regard, the gas permeability (or gas impermeability) (cm$^3$/cm$^2$·s) of each layer can be measured by using a gas permeability testing machine. The protective layer 3 has a function of protecting one surface of the through substrate, and further can function at least as a part of the base material of the protective member 2. For example, the protective layer 3 may be formed as one layer of the base material having a multi-layered constitution and excellent strength, which the protective member has.

As the material constituting the protective layer, for example, the following ones may be used. That is, a resin material that has been usually used such as a film, a plastic in a plate shape, and a rubber in a sheet shape, of polypropylene (PP), polycarbonate (PC), polyethylene terephthalate (PET), polyimide (PI) or the like, or an inorganic material such as a metal and a ceramic, which is typified by silicon and glass, may be used. These materials may be used singly alone, or in combination of multiple kinds thereof.

Further, the protective layer may be a single-layered constitution, or may also be a multilayer (multi-layered) constitution.

The thickness of the protective layer 3 is not particularly limited, and may be appropriately set within the range that the processing of an atmosphere communication layer or the like and the processing (production step) of a substrate are not hindered.

The atmosphere communication layer 4 has a structure in which gas is passed through from at least a part of a layer side surface part to communicate with at least a part of a front surface (surface on the upper side of the drawing sheet shown in FIGS. 1A to 1E) of the atmosphere communication layer. For this reason, when the protective member is formed on a second surface of a through substrate, the permeation point on a front surface of the atmosphere communication layer is arranged so as to communicate with a through hole 1a, and the atmosphere communication layer 4 has a function of communicating the through hole part with the atmosphere outside of the substrate. In this regard, the atmosphere communication layer 4 may be a single-layered constitution or may also be a multi-layered constitution as long as it has the above-described function, and the constitution of the atmosphere communication layer 4 is not particularly limited.

Next, an embodiment of the protective member 2 will be specifically described by referring to some examples. In the method of producing a structure according to the present invention, in a peeling step of a support member, a support member is peeled off from a resin layer in a state that a through hole of a through substrate is communicated with atmosphere by at least an atmosphere communication layer. For this reason, as the protective member, a protective member may be appropriately used as long as a structure in which gas is passed through from at least a part of a layer side surface part of an atmosphere communication layer to communicate with a through hole can be formed when the protective member is placed on a second surface of the through substrate.

For example, when a protective member has a structure in which a recess communicating with a through hole of a through substrate is provided, and the recess (indirectly or directly) communicates with the atmosphere, the through hole of the through substrate can be communicated with atmosphere via this recess. In this regard, the recess penetrates at least a part of the atmosphere communication layer in a thickness direction of the layer (in the vertical direction on the drawing sheet shown in each of FIGS. 1A to 1E), and can have a bottom in an inner part of the atmosphere communication, on a surface of a protective layer, or in an inner part of the protective layer. Further, in a case where an intermediate layer is placed between the atmosphere communication layer and the protective layer, the above-described recess can also have a bottom on a surface of the intermediate layer or in an inner part of the intermediate layer. That is, not only the atmosphere communication layer but also the protective layer and the intermediate layer can contribute to the atmosphere communication of the through hole of the through substrate.

Figure 2A:
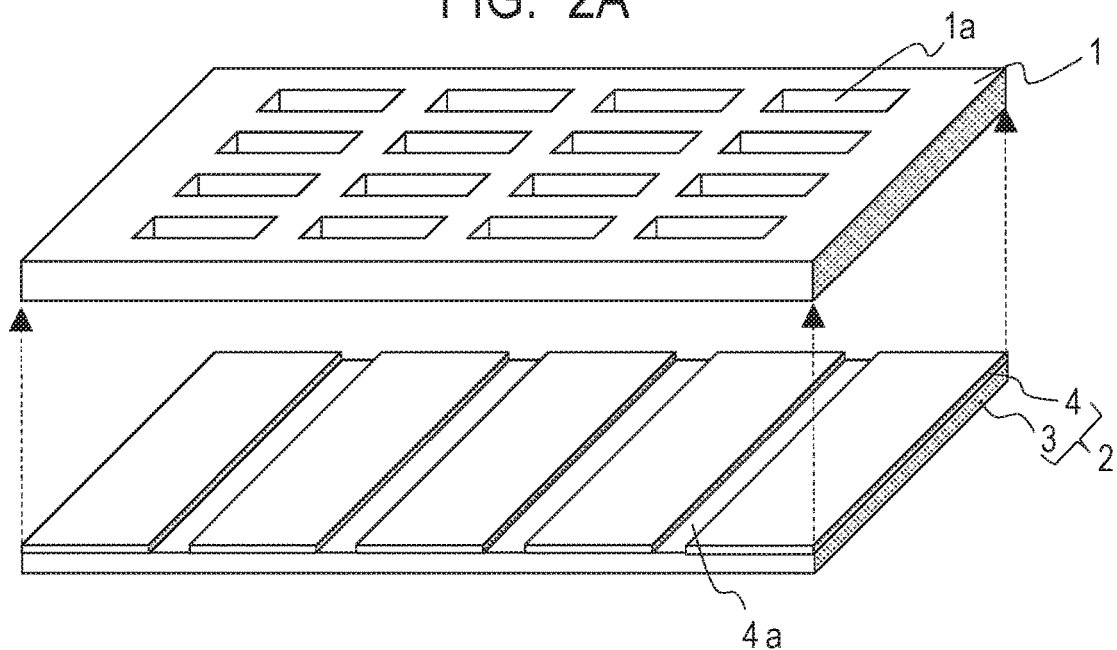
FIGS. 2A, 2B and 2C are schematic perspective views showing structure bodies before a protective member forming step (FIG. 2A), after a protective member forming step (FIG. 2B), and after a peeling step (FIG. 2C) in one embodiment of the method of producing a structure according to the present invention.
Figure 2B:
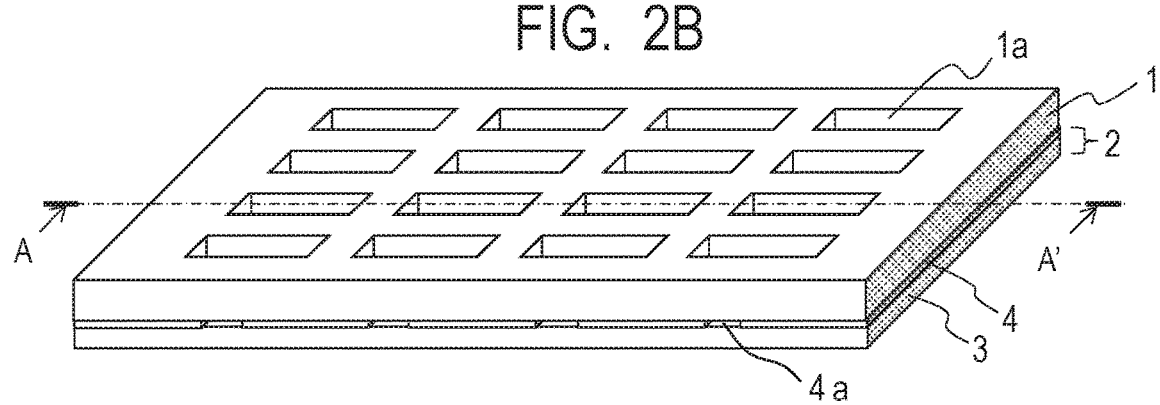

As an example of the recess, the following ones can be mentioned. In this regard, FIGS. 2A and 2B are schematic perspective views showing states before and after a protective member 2 is stuck onto a through substrate 1, respectively, and FIG. 1B corresponds to a sectional view when the perspective view shown in FIG. 2B is cut along the line A-A'. In the protective member 2 shown in each of these drawings, a recess (groove) 4a that penetrates an atmosphere communication layer 4 in a short direction (for example, in the vertical direction on the drawing sheet shown in each of FIGS. 1A to 1E) of a substrate (or a protective member), and further has a bottom on a surface of a protective layer 3 is formed. This protective member 2 has an opening by a groove 4a in a part of the layer side surface part of the atmosphere communication layer, and is stuck onto the through substrate 1 at a position where gas can be passed through from the opening to communicate with a through hole 1a of the through substrate. That is, the groove 4a plays a role of communicating the atmosphere outside the through substrate on which a protective member is placed with the space part in a through hole, and is formed at a position where at least the through hole 1a can be communicated with the atmosphere outside. Accordingly, the space part in a through hole is placed under an open system environment via (for example, the above-described groove 4a of) the protective member.

In this regard, the shape of the recess is not limited to the striped pattern as shown in FIG. 2A, may be a recess (void) with a dot pattern of round shape, square shape or the like, a groove with a lattice pattern, or the like, and is not particularly limited. As the structure of the protective member having a dot-shaped recess, for example, there is a structure in which an atmosphere communication layer has a dot-shaped through hole, and has a gas-impermeable layer (for example, an adhesive layer or a photosensitive resin layer) being gas impermeability and a layer having gas permeability (gas-permeable layer) in this order on a second surface of a through substrate. In this case, by arranging a dot-shaped through hole so as to communicate with a through hole of a through substrate, the atmosphere which permeates from the layer side surface part of the gas-permeable layer can communicate with the through hole of the through substrate via the dot-shaped through hole. In addition, from the viewpoint of further exerting the effects of the present invention, the gas impermeability of the gas-impermeable layer is preferably less than 0.0001 $cm^3/cm^2 \cdot s$. Further, from the viewpoint of further exerting the effects of the present invention, the gas permeability of the gas-permeable layer is preferably 0.01 $cm^3/cm^2 \cdot s$ or more, and more preferably 0.1 $cm^3/cm^2 \cdot s$ or more.

In this regard, in a case where a protective member has, for example, the above-described recess (groove) 4a, when the protective member and a through substrate are bonded to each other, a case where a base material part (for example, a protective layer) of the protective member and a second surface of the through substrate come into contact with each other due to the deflection of the protective member or the like may be considered. In this case, it is considered that depending on the degree of the contact between the protective member and the through substrate, the through hole of the through substrate may be blocked by the base material of the protective member, so that the through hole is hardly communicated with atmosphere. For this reason, it is preferred that the protective member has a constitution in which a base material of the protective member does not come into contact with a through substrate due to the deflection of the base material when the protective member is stuck onto the through substrate. In this regard, as shown in each of FIGS. 1A to 1E and FIGS. 2A to 2C, multiple recesses can be provided to a protective member, and for example, depending on the (average) width of the recess, the (average) depth of the recess in the multiple recesses, and further the quality of and the thickness of the base material and the like in the protective member, a situation of non-contact can be easily made when both of the protective member and the through substrate are stuck to each other.

Although depending on the hardness of, the ease of preparation of, or the like of the material used for a part (for example, an atmosphere communication layer and a protective layer) where the recess is formed, the (average) depth of the recess (in particular, groove 4a) is preferably 1 μm or more from the viewpoint of the gas permeability, and more preferably 5 μm or more from the viewpoint of stable permeation. Further, from the viewpoint of preventing the cracks of a substrate during lamination or the decrease of adhesion due to decrease of thermal conductivity, the (average) depth of the recess (in particular, groove 4a) is preferably 1 mm or less, and more preferably 100 μm or less.

In this regard, the depth of the recess means the distance (length) from the position (opening of the recess) on a front surface of an atmosphere communication layer 4 to the position of the bottom of the recess in the protective member 2 shown in each of FIGS. 1A to 1E, and has the same thickness as that of the atmosphere communication layer in FIG. 1B. In addition, in a case where a groove 4a as shown in each of FIGS. 1A to 1E and FIGS. 2A to 2C is formed in a protective member 2 as the recess, for example, a recess (groove) having a (substantially) constant depth can be formed in the short direction of the protective member.

In this regard, the (average) depth of the recess can be specified by using a contact-type step measuring instrument. For example, in a case where a protective member 2 has multiple recesses (for example, grooves) 4a, the average depth of the recess can be specified as follows. That is, in the multiple recesses provided in a protective member 2, the depth is measured at 5 or more positions (for example, including the depth in the vicinity of the center and in the vicinity of the outermost part of the top, bottom, left, and right on a front surface of the protective member (front surface of an atmosphere communication layer in each of FIGS. 1A to 1E)) in each of recesses by the above-described step measuring instrument. Subsequently, an average value of the obtained at least 5 measurement values is determined and taken as the average depth of the recess.

In this regard, in measuring the average depth of the recess, from the viewpoint of the accuracy, the number of measurements is preferably as many as possible. For example, by measuring the depth of the recess placed in an intermediate part between the vicinity of the center and the vicinity of the outermost part on a front surface of a protective member to increase the number of the measurements, the accuracy can be further improved.

In addition, although depending on the constitution of or the quality of the protective member, the processing accuracy at the time of forming, or the like, the (average) width of the recess is, for example, in a case of using a rubber or a pressure-sensitive adhesive for the protective member, preferably in the following range. That is, from the viewpoint of reliably forming the groove communicating with atmosphere, the (average) width of the recess is preferably 0.5 mm or more, and more preferably 1.0 mm or more. Further, from the viewpoint of fixing to a substrate, the (average) width of the recess is preferably 50 mm or less, and more preferably 20 mm or less.

On the other hand, in a case where a photosensitive resin is used for a protective member (for example, an atmosphere communication layer), a fine recess (groove) can be made by using a photolithography technique. However, from the viewpoint of the atmosphere communication of a through hole, the (average) width of the recess is preferably 10 μm or more, and more preferably 100 μm or more. Further, from the viewpoint of fixing to a substrate, the (average) width of the recess is preferably 50 mm or less, and more preferably 20 mm or less.

In this regard, in the protective member 2 shown in each of FIGS. 1A to 1E, the (average) width of the recess means the distance (length) of the recess in the longitudinal direction (right and left direction shown in each of FIGS. 1A to 1E) of the protective member. More specifically, the (average) width means a distance between the middle point (between the opening part and the bottom in the recess) on the left side wall surface and the middle point (between the opening part and the bottom in the recess) on the right side wall surface, the left and right side wall surfaces (shown in each of FIGS. 1A to 1E) constituting the recess. In each of FIGS. 1A to 1E, a recess that penetrates the atmosphere communication layer 4 from the front surface to the back surface in a (substantially) perpendicular direction and has the bottom on a surface of a protective layer 3 is formed, however, the shape of the recess is not limited thereto. For example, the recess may have a tapered shape that has the opening area narrowing from the opening part toward the bottom of the recess.

In this regard, the (average) width of the recess can be specified by using a contact-type step measuring instrument. For example, in a case where a protective member 2 has multiple recesses (for example, grooves) 4a, the average width of the recess can be specified as follows. That is, in the multiple recesses provided in a protective member 2, the width is measured at 5 or more positions (for example, including the width in the vicinity of the center and in the vicinity of the outermost part of the top, bottom, left, and right on a front surface of the protective member) in each of recesses by the above-described step measuring instrument. Subsequently, an average value of the obtained at least 5 measurement values is determined and taken as the average width of the recess.

In this regard, in measuring the average width of the recess, from the viewpoint of the accuracy, the number of measurements is preferably as many as possible. For example, by measuring the width of the recess placed in an intermediate part between the vicinity of the center and the vicinity of the outermost part on a front surface of a protective member to increase the number of the measurements, the accuracy can be further improved.

Although depending on the material for the protective member (for example, the base material) to be used, with respect to the (average) width of the recess and the (average) depth of the recess, from the viewpoint of the atmosphere communication of a through hole, the width of the recess is preferably 500 times or less, and more preferably 200 times or less the depth of the recess.

In this regard, a constitution in which a protective member does not have a recess may also be accepted, and for example, a constitution in which an atmosphere communication layer constituted of a layer (with a flat surface, for example, a gas-permeable adhesive layer) having gas permeability is included may be accepted. In this case, the layer having gas permeability can be subjected to permeation from the entire layer side surface part, and can exert the function as the atmosphere communication layer. As the gas-permeable adhesive layer, for example, one obtained by spray-coating a pressure-sensitive adhesive on a surface of a three-dimensional structure of a nonwoven fabric, a sponge, a porous body or the like can be used. The thickness of such an atmosphere communication layer not having a recess is preferably 100 μm or more from the viewpoint of the gas permeability, and more preferably 200 μm or more from the viewpoint of stable permeation. Further, from the viewpoint of the cracks of a substrate during lamination or the thermal conductivity, the thickness of such an atmosphere communication layer not having a recess is preferably 1 mm or less, and more preferably 500 μm or less. In addition, from the viewpoint of further exerting the effects of the present invention, the gas permeability of the atmosphere communication layer not having a recess is preferably 0.01 $cm^3/cm^2 \cdot s$ or more, and more preferably 0.1 $cm^3/cm^2 \cdot s$ or more.

As described above, the structure of the protective member can be appropriately set, however, hereinafter, the description focused on a protective member 2 having a recess (groove) 4a will be made.

A protective member 2 having a recess 4a can be prepared by patterning, for example, an atmosphere communication layer including a material layer such as an adhesive layer, a photosensitive resin layer, and a gas-permeable layer, and a gas-impermeable protective layer. Part or the whole of the layer constituting an atmosphere communication layer may be gas permeable or gas impermeable. If the layer constituting an atmosphere communication layer has gas permeability, permeation is performed not only from the above-described recess (groove) 4a but also from the layer side surface part of a gas-permeable layer for the space part in the through hole.

In this regard, in a case where the atmosphere communication layer 4 includes an adhesive layer (adhesive part), the atmosphere communication layer itself can have a function of sticking the protective member onto a through substrate. Accordingly, the atmosphere communication layer preferably has an adhesive layer (adhesive part) on the second surface side of the through substrate. Further, in a case where the atmosphere communication layer not having an adhesive function is used, as described above, separately, the through substrate and the protective member can be bonded to each other by lamination or the like.

Figure 5A:
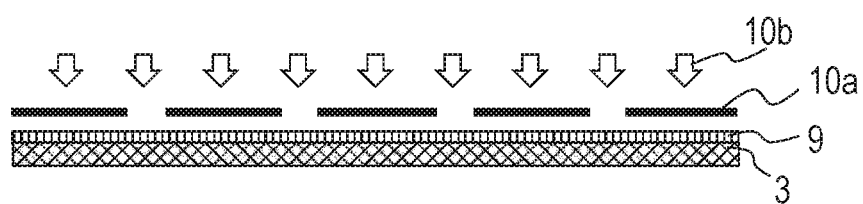
FIGS. 5A, 5B and 5C are schematic sectional views illustrating a preparation method of a protective member using a photosensitive resin layer as an atmosphere communication layer.
Figure 5B:
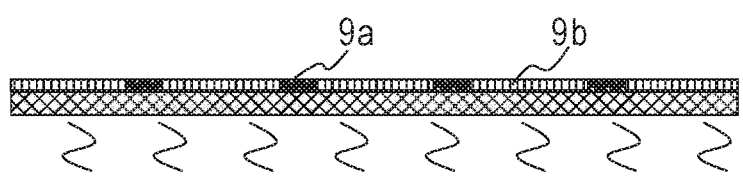
Figure 5C:

A protective member that is constituted of at least an atmosphere communication layer including a photosensitive resin layer and of a protective layer, and has a groove 4a can be prepared, for example, by the following method shown in FIGS. 5A to 5C. First, as shown in FIG. 5A, on a front surface of a gas-impermeable protective layer 3, for example, a positive-type photosensitive resin (for example, trade name: OMR-83 manufactured by TOKYO OHKA KOGYO CO., LTD.) is applied to form a photosensitive resin layer 9. Next, this photosensitive resin layer 9 is exposed to UV rays 10b via a photomask 10a to prepare an exposed part 9a and an unexposed part 9b as shown in FIG. 5B. Subsequently, by performing post baking as necessary and development, a protective member having a photosensitive resin layer on which a groove 4a of a desired pattern shown in FIG. 5C has been formed is prepared. Further, by sticking the protective member 2 thus formed onto a protective surface (second surface) of a through substrate 1 by lamination or the like, a substrate shown in each of FIGS. 1B and 2B can be obtained. In this regard, a bottom of a groove 4a is formed on a surface of a protective layer 3 in each of FIGS. 5A to 5C, however, a groove 4a that penetrates the atmosphere communication layer 4 (photosensitive resin layer 9) and has the bottom in an inner part of the protective layer may be formed.

In this regard, the thickness of the photosensitive resin layer 9 can be appropriately set, however, it is preferred to form the recess (groove) that is to be formed in the photosensitive resin layer 9 so as to have the depth of the recess (groove) within the range described above.

In FIGS. 5A to 5C, an example in which a positive-type photosensitive resin is used on the premise that a protective member 2 is removed from a second surface of a through substrate in a subsequent removal step is shown. However, if the atmosphere communication layer can be used as it is as a part of the structure, a photosensitive resin layer is formed by using a negative-type photosensitive resin, and in the above-described removal step, the photosensitive resin layer may be left on the second surface of the through substrate, and only the protective layer 3 may be peeled off (removed).

Figure 6A:
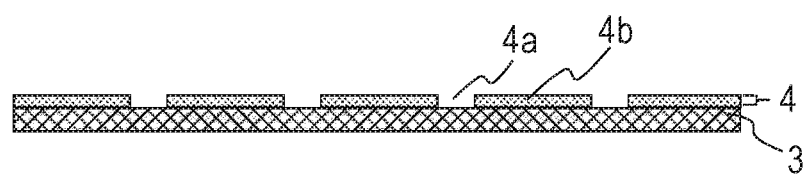
FIGS. 6A, 6B and 6C are schematic sectional views showing three examples of a protective member.
Figure 6B:
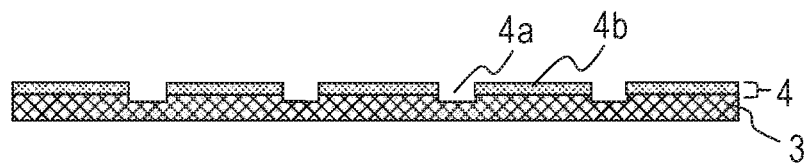
Figure 6C:
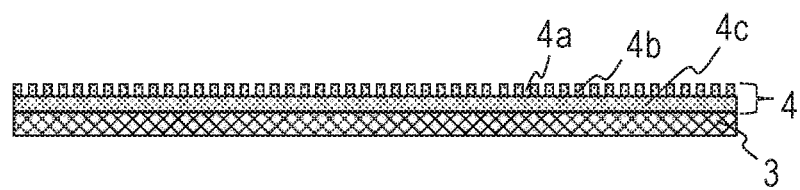

FIGS. 6A to 6C are schematic sectional views showing three examples of a protective member.

FIG. 6A is a protective member in which an atmosphere communication layer 4 constituted of a groove 4a and an adhesive part 4b is formed on a protective layer 3. For the adhesive part 4b, an adhesive material represented by a silicone-based pressure-sensitive adhesive, an acrylic pressure-sensitive adhesive, or the like, a rubber having tackiness such as silicone rubber or urethane rubber, or a resin material such as an acrylic resin having enhanced tackiness may be used. However, as the material constituting the adhesive part, it is preferred to use a material that hardly causes component migration or cohesive failure on the through substrate side after peeling of the protective member in the removal step to be described later.

In addition, after the removal step, if necessary, in order to remove the material constituting this adhesive part, washing of the through substrate may be performed, or washing performed in the later step may also serve as washing of the material constituting the adhesive part at the same time.

The formation (patterning) of the adhesive part 4b may be performed when a material such as a pressure-sensitive adhesive is applied onto a protective layer, that is, the formation (patterning) may be performed by selectively applying a pressure-sensitive adhesive or the like. Further, after the pressure-sensitive adhesive or the like is applied onto the entire surface of the protective layer to form an adhesive layer, the patterning may be performed by selectively removing the unnecessary part with the use of a solvent or the like that dissolves the material constituting the adhesive layer, or with the use of laser processing or the like.

In addition, FIG. 6B is an example in which for the protective member having at least a protective layer and an adhesive layer, a groove 4a penetrating the adhesive layer and having the bottom in an inner part of the protective layer is formed. The groove 4a and the adhesive part 4b shown in this FIG. 6B can be formed, for example, by the following method. That is, at first, by performing chemical etching or physical processing on the protective layer, an uneven shape is formed on a surface of the protective layer. Alternatively, as necessary, a general metal, ceramic, or the like is formed into a film on a protective layer, and a desired pattern is etched on this film by using a resist or the like to form an uneven on the surface. Subsequently, onto a protrusion of the uneven shape formed in this way, by selectively applying a pressure-sensitive adhesive or the like, a groove 4a and an adhesive part 4b can be arranged. In addition, after the pressure-sensitive adhesive or the like is applied onto the entire surface of the protective layer on which unevenness processing has not been performed to form an adhesive layer, by performing laser processing or the like on the protective layer and the adhesive layer, a groove 4a can also be formed.

FIG. 6C is a protective member in which a gas-permeable layer 4c and an adhesive layer are placed in this order on a protective layer 3 and a groove 4a penetrating the adhesive layer and having the bottom on a surface of the gas-permeable layer is formed, and the adhesive layer (adhesive part) and the gas-permeable layer are placed in this order on a second surface of the through substrate. As the material constituting the gas-permeable layer 4c, for example, a fiber such as nonwoven fabric, an inorganic or organic porous body, a material such as a foam body (sponge) formed of urethane, polyethylene, various kinds of rubber, or the like can be mentioned, but it is not limited thereto.

In this protective member, an adhesive part 4b is arranged to the gas-permeable layer 4c within the range not impairing the gas permeability of the gas-permeable layer. As the specific forming method of the adhesive part 4b, for example, a method in which a pressure-sensitive adhesive or the like is selectively spray-coated on a gas-permeable layer to form a groove 4a and an adhesive part 4b can be mentioned, and can be preferably used. However, another forming method may be used within the range that the effects of the present invention are exerted.

Although depending on the material used for a gas-permeable layer or the like, the thickness of the gas-permeable layer 4c can be appropriately set within the range that the gas permeability of a substrate is ensured and fractures, cracks or the like of the substrate are not generated during lamination, and is not particularly limited. Further, from the viewpoint of further exerting the effects of the present invention, the gas permeability of the gas-permeable layer is preferably 0.01 $cm^3/cm^2 \cdot s$ or more, and more preferably 0.1 $cm^3/cm^2 \cdot s$ or more.

In this regard, the thickness of the adhesive part 4b shown in each of FIGS. 6A to 6C can be appropriately set, however, it is preferred to form the recess (groove) that is to be formed in the adhesive part 4b (and the protective layer 3) so as to have the (average) depth of the recess (groove) within the range described above.

Further, in FIGS. 1A to 1E, 2A to 2C, 5A to 5C and 6A to 6C, an example of using a protective member that is constituted of a gas-impermeable protective layer 3 having a protective function and a function as a base material, and an atmosphere communication layer 4 of an adhesive part 4b and the like is described. However, in the method of producing a structure according to the present invention, without being limited to this form, an intermediate layer such as a relaxation layer or an adhesion layer may be provided on a protective layer 3, and an atmosphere communication layer 4 may be formed onto the intermediate layer within the range that the effects of the present invention can be exerted.

(DFR Layer Forming Step)

Next, as shown in FIG. 1C, on a first surface 1i of the through substrate, a dry film resist layer (DFR layer) 7 having a resin layer 5 and a support member 6 in this order is formed. As the dry film resist used for forming a DFR layer, for example, one known in the field of liquid ejection head can be appropriately selected and used, and for example, a DFR having a support member of a PET film and a resin layer containing an epoxy resin can be used. In addition, this DFR can also be appropriately prepared by a known technique (DFR preparation step).

The formation of a DFR layer on a first surface of a through substrate can be performed by sticking the DFR on the first surface, for example, by lamination (DFR layer sticking step). Although depending on the resin material used for the DFR, in the lamination, the adhesion to the through substrate can be further enhanced by heating at around 30 to 120° C. and pressing with a roller or the like. At this time, the gas (atmosphere) contained in a through hole 1a part of the through substrate is volume-expanded with heating during the lamination, and is volume-shrunk with cooling after the lamination. However, in the present invention, since an atmosphere communication layer 4 is provided in a protective member 2, the sticking can be performed without changing the pressure in the through hole part.

In addition, in order to suppress the minute bubbles generated between the through substrate and the DFR during lamination, in general, operation involving a series of pressure fluctuations such that the lamination is performed under a reduced pressure environment, and then the environment is returned to atmospheric pressure is performed. In the present invention, as described above, since an atmosphere communication layer 4 is provided in a protective member 2, the influence of these pressure fluctuations can be suppressed.

(Peeling Step)

Figure 2C:
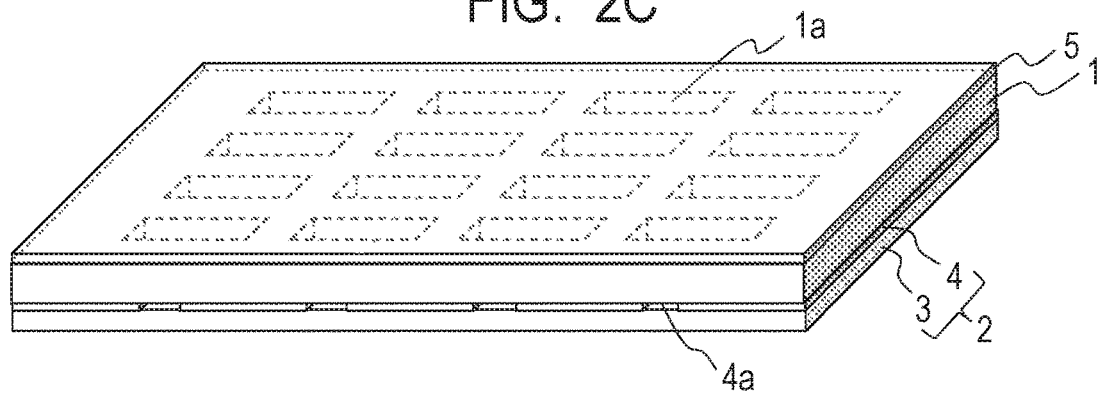

Next, as shown in FIG. 1D, a support member 6 is peeled off from a resin layer 5 in a state that a through hole 1*a* is communicated with atmosphere by at least an atmosphere communication layer. In addition, FIG. 2C is a schematic perspective view corresponding to a schematic sectional view of FIG. 1D. In FIG. 2C, a through hole 1*a* and the like formed in a through substrate are shown with dashed lines.

Figure 3:
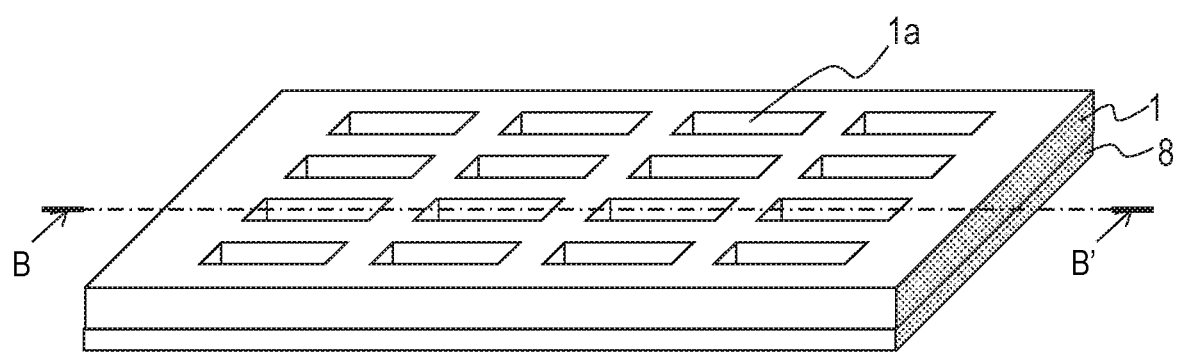
FIG. 3 is a schematic perspective view showing a structure after a protective member forming step in one example of a method of producing a structure using a conventional protective member.
Figure 4A:
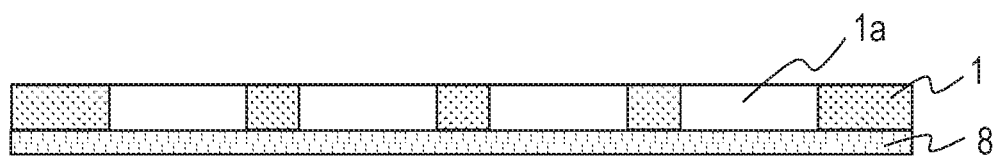
FIGS. 4A, 4B and 4C are schematic sectional views illustrating respective steps in one example of the method of producing a structure using a conventional protective member.

In the conventional method of producing a structure, as shown in each of FIGS. 3 and 4A, as the protective member, a gas-impermeable adhesive tape 8 or the like that is to be usually used is used for protecting a processed surface of a through substrate. For this reason, a through hole part of the through substrate becomes an enclosed space at the time of peeling a support member 6, and a resin layer 5 has been deformed in some cases. In this regard, FIG. 3 is a schematic perspective view showing a structure after a protective member forming step in one example of a method of producing a structure using a conventional protective member. In addition, FIGS. 4A to 4C are views illustrating respective steps in one example of the method of producing a structure using the conventional protective member, and FIG. 4A corresponds to a sectional view when the structure shown in FIG. 3 is cut along the line B-B'.

Figure 4B:
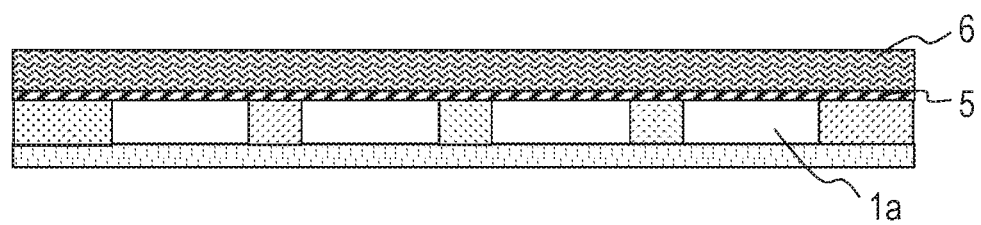
Figure 4C:
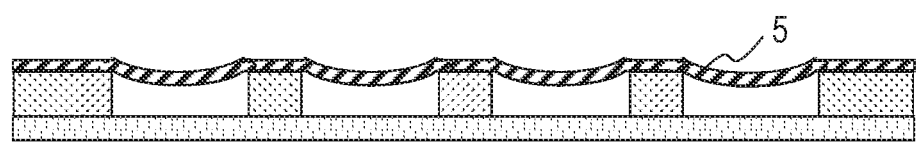

In the conventional method, as shown in FIG. 4B, a DFR having a resin layer 5 and a support member 6 in this order is formed into a film on a front surface (surface on the upper side of the drawing sheet) of the through substrate, for example, by lamination. As described above, in the lamination, the sticking is performed by heating to around 30 to 120° C. and pressing with a roller or the like. In the conventional method, the space part of a through hole is sealed with a protective member (adhesive tape) 8 and a DFR layer, and at the time of lamination, the gas contained in this space part is heated and is sealed in a volume-expanded state. For this reason, when the through substrate on which the DFR layer has been placed is cooled after the lamination, the volume-expanded gas in the space part is volume-shrunk with temperature cooling, and the space part becomes in a reduced pressure state.

In a state shown in FIG. 4B, since the resin layer 5 is held by the support member 6, the deformation of the resin layer 5 is not generated. However, when the support member 6 is peeled off, since the space part in the through hole is in a reduced pressure state, the resin layer is deformed as shown in FIG. 4C. In addition, similarly, also in a case where a DFR is laminated onto the through substrate shown in FIG. 4A under a reduced pressure environment in order to suppress the generation of minute bubbles, the space part in the through hole is sealed with a reduced pressure state. For this reason, when the support member 6 is peeled off, similarly, the deformation of the resin layer 5 as shown in FIG. 4C is generated.

In this regard, in a case where a gas permeable adhesive tape 8 is used as the protective member in the conventional method, the deformation of the resin layer 5 at the time point when the support member 6 is peeled off is not generated. However, when a gas permeable adhesive tape is used as a protective member in preparation of a semiconductor or a liquid ejection head, the space part in a through hole becomes in a reduced pressure state through the adhesive tape when suction operation using a device is required. For this reason, as a result, the deformation of the resin layer as shown in FIG. 4C is generated.

On the other hand, in the method of producing a structure according to the present invention, as described above, by arranging at least an atmosphere communication layer 4 having a specific structure and a gas-impermeable protective layer 3 on a protective member 2, the generation of pressure fluctuations of a space part in a through hole can be prevented. For this reason, even under an environment where the pressure fluctuations are easily generated, for example, during the peeling of a support member or during the suction operation using a device, the deformation of the resin layer 5 can be suppressed, and a structure having a resin layer that is excellent in flatness can be obtained. In this regard, as a matter of course, the peeling step is preferably performed while maintaining the preferable sticking state between the through substrate and protective member (for example, the contact area between the through substrate and the protective member, or the like) as described above.

(Patterning Step)

Next, as necessary, a resin layer 5 can be patterned into a desired shape (not shown). In a case where the resin layer 5 contains a (positive-type or negative-type) photosensitive resin, the patterning can be performed by a method such as photolithography.

(Removal Step)

Next, as shown in FIG. 1E, a protective member 2 can be removed (peeled off) from a second surface 1*ii* of a through substrate 1. In this regard, in a case where an atmosphere communication layer 4 can be utilized as a part of a structure, at least a protective layer 3 of the protective member is peeled off. The removal method can be appropriately selected depending on the material or the like of the protective member (for example, an atmosphere communication layer) used, and is not particularly limited. For example, the protective member can be peeled off by using a peeling device.

From the above, a structure having a structure on at least one of the surfaces of a through substrate can be prepared.

<Protective Member>

The protective member of the present invention is characterized by being used in the above-described method of producing a structure, and has the following structure. That is, as shown in FIGS. 1A to 7, the protective member has an atmosphere communication layer 4, and a gas-impermeable protective layer 3 placed on a back surface of the atmosphere communication layer 4, and the atmosphere communication layer 4 has a structure in which gas is passed through from at least a part of a layer side surface part to communicate with at least a part of a front surface of the atmosphere communication layer.

<Protective Substrate>

The protective substrate obtained by the method of producing a protective substrate of the present invention has the following constitution. As shown in FIG. 1C, the protective substrate has a through substrate 1 having a through hole 1*a* penetrating a surface of the substrate, a DFR layer 7 being placed on a first surface 1*i* and having a resin layer 5 and a support member 6 in this order on the first surface, and a protective member 2 placed on a second surface 1*ii*. Further, in the protective substrate according to the present invention, the protective member 2 has an atmosphere communication layer 4 having a structure in which gas is passed through from at least a part of a layer side surface part to communicate with a through hole 1*a*, and a gas-impermeable protective layer 3 in this order on the second surface. In addition, the protective substrate according to the present invention is in a state that a through hole of a through substrate is communicated with atmosphere by at least an atmosphere communication layer.

By performing the operation involving pressure fluctuations in a through hole part, such as peeling of a support member 6, and suction operation using a device, with the use of such a protective substrate, the deformation of the resin layer 5 can be prevented.

<Method of Producing Protective Substrate>

The method of producing a protective substrate according to the present invention includes the following steps.

A step of forming the above-described protective member on a second surface of a through substrate.

A step of forming the above-described DFR layer on a first surface of a through substrate.

Herein, in the method of producing a protective substrate according to the present invention, a protective member is formed on a second surface of a through substrate in an arrangement that a through hole of the through substrate is communicated with atmosphere by at least the atmosphere communication layer in the step of forming the protective member.

Further, the method of producing a protective substrate according to the present invention can also include the above-described through substrate preparation step, processing treatment step, and the like, and the step of forming the protective member can include the above-described protective member preparation step and protective member sticking step. In addition, the step of forming the above-described DFR layer can include the above-described DFR preparation step and DFR layer sticking step. With respect to the description of each of the steps, it has been already described in the description of the method of producing a structure, and therefore the description is omitted.

<Liquid Ejection Head>

A liquid ejection head obtained by the method of producing a liquid ejection head of the present invention can be mounted on a device such as a printer, a copying machine, a facsimile machine having a communication system, and a word processor having a printer unit, and further an industrial recording device by a complex combination of various processing units.

Figure 8A:
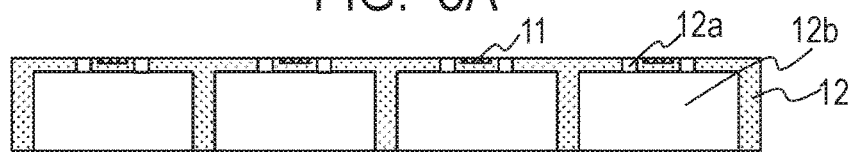
FIGS. 8A, 8B, 8C, 8D, 8E, 8F, 8G, 8H, 8I, 8J, 8K, 8L and 8M are schematic sectional views illustrating parts ((A) to (M)) of steps in one example of a method of producing a liquid ejection head of the present invention.
Figure 8B:
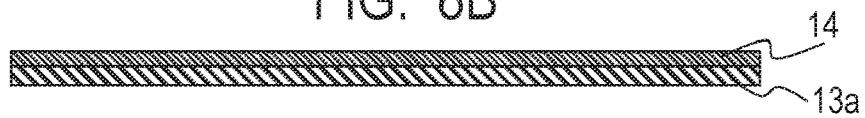
Figure 8C:
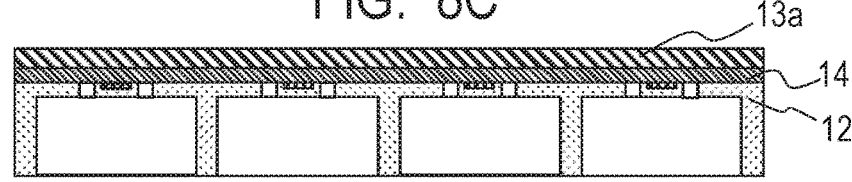
Figure 8D:
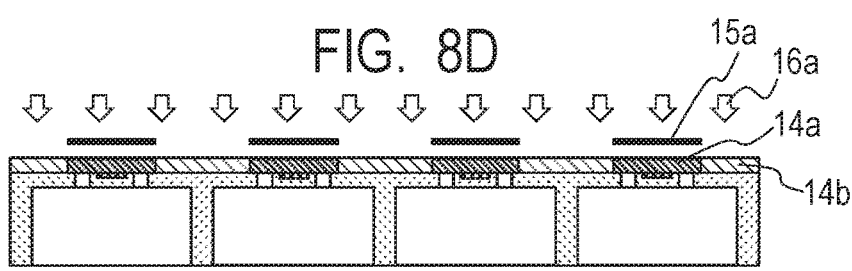
Figure 8E:
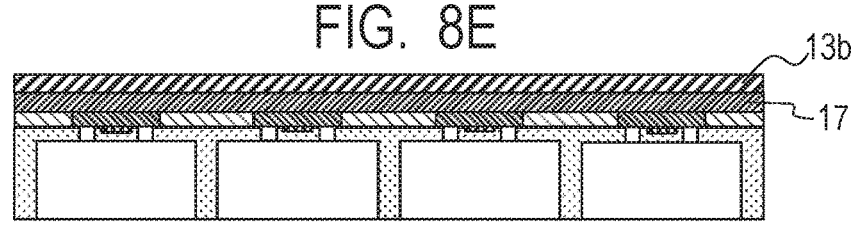
Figure 8F:
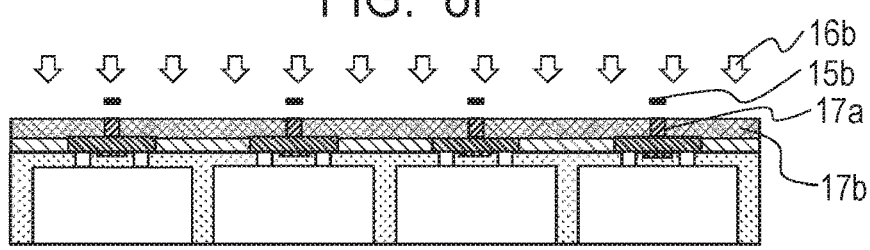
Figure 8G:
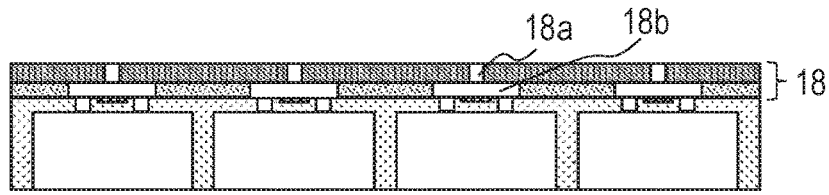
Figure 8H:
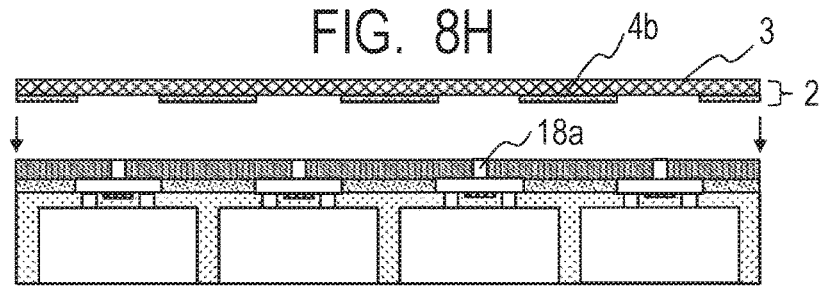
Figure 8I:
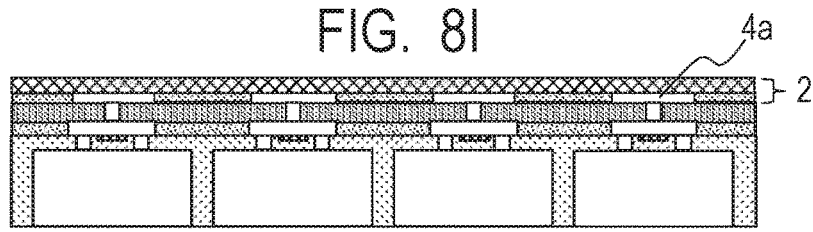
Figure 8J:
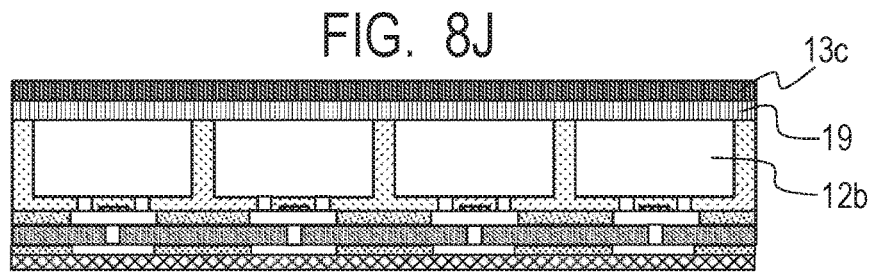
Figure 8K:
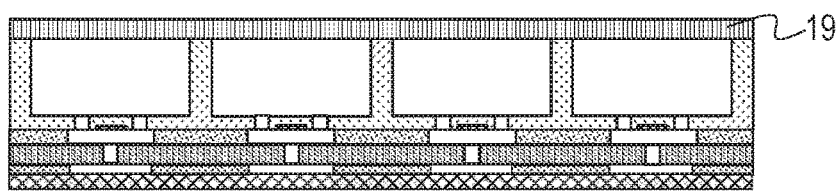
Figure 8L:
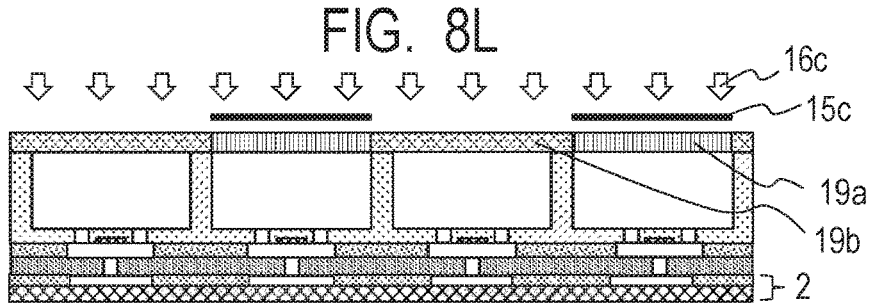
Figure 8M:
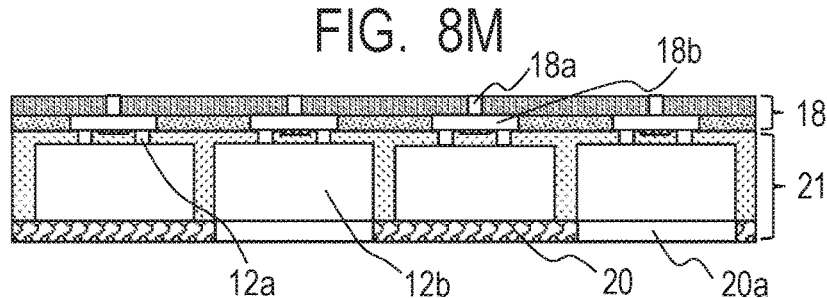
Figure 9A:
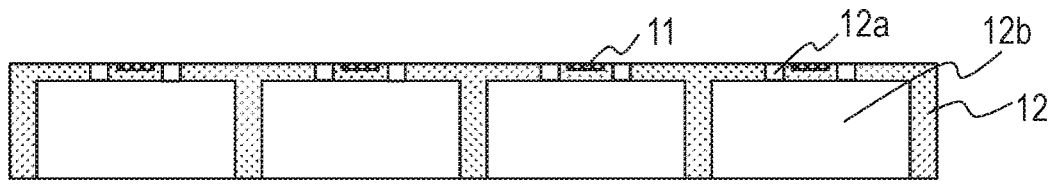
FIGS. 9A, 9B, 9C, 9D, 9E, 9F, 9G, 9H, 9I, 9J, 9K, 9L, 9M, 9N and 9O are schematic sectional views illustrating parts ((A) to (O)) of steps in another example of a method of producing a liquid ejection head of the present invention.
Figure 9B:
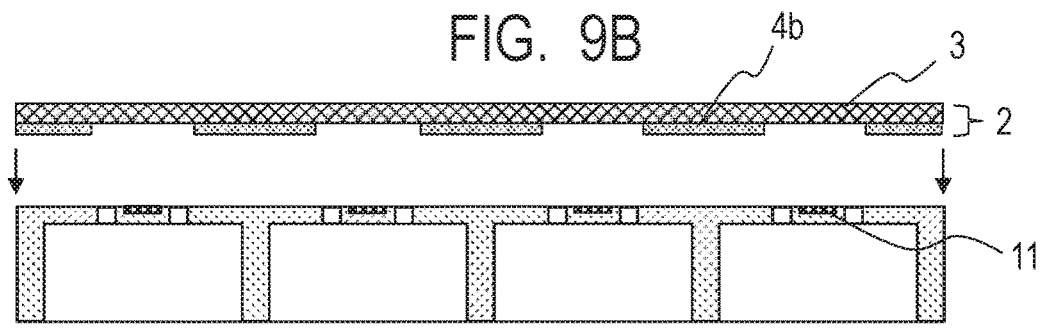
Figure 9C:
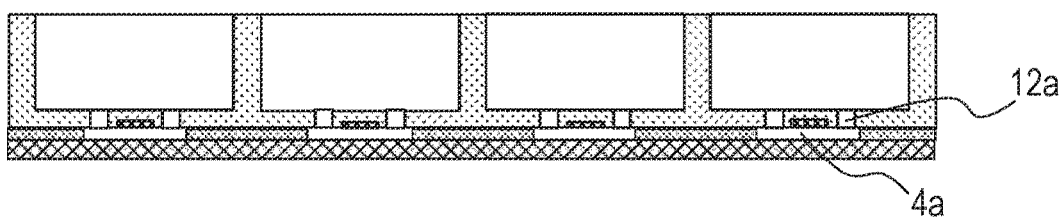
Figure 9D:
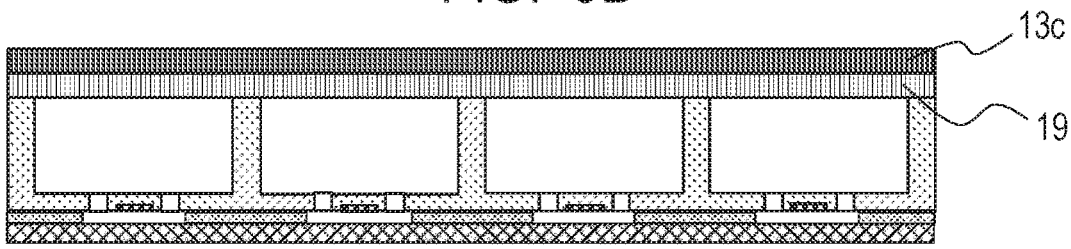
Figure 9E:
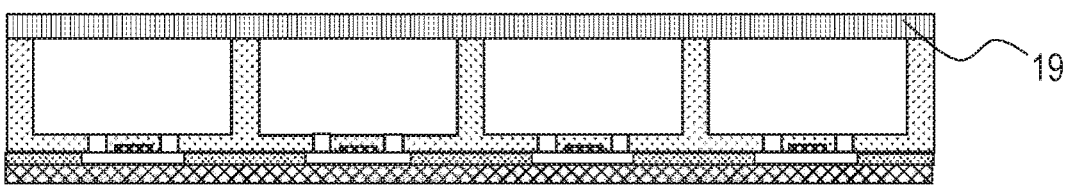
Figure 9F:
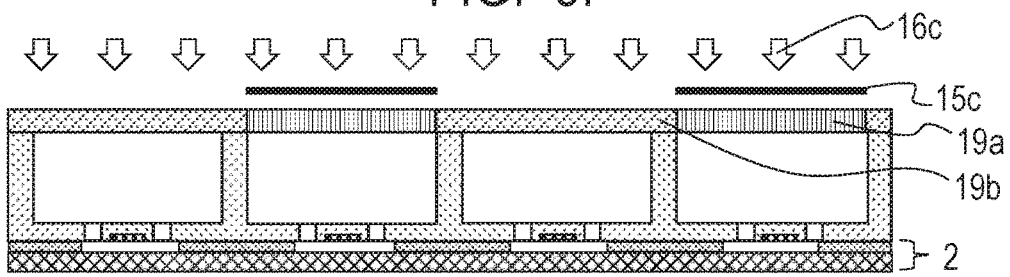
Figure 9G:
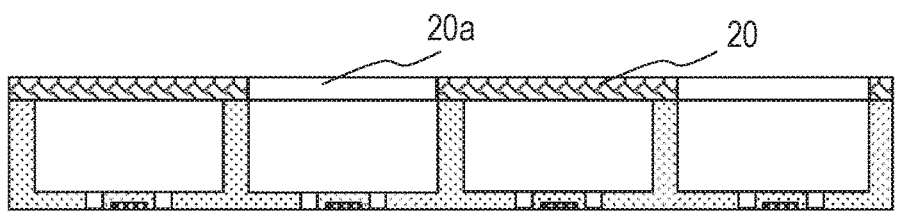
Figure 9H:
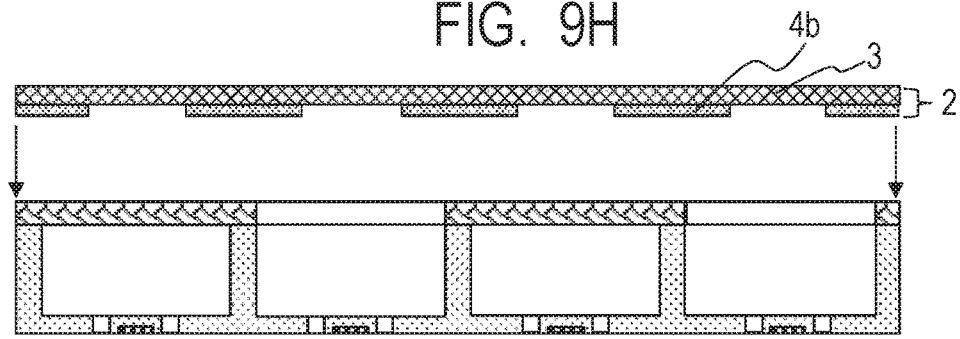
Figure 9I:
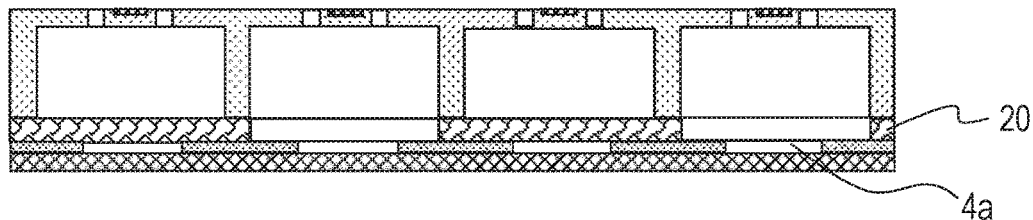
Figure 9J:
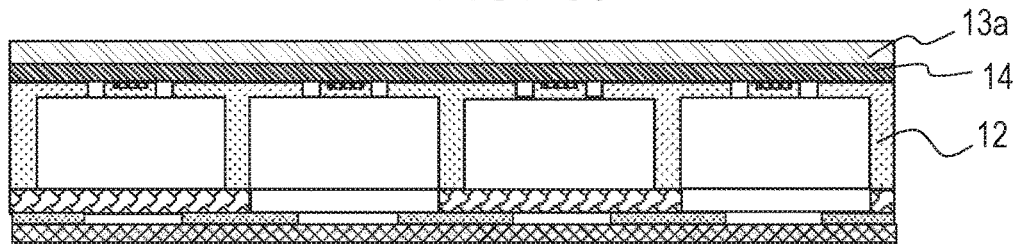
Figure 9K:
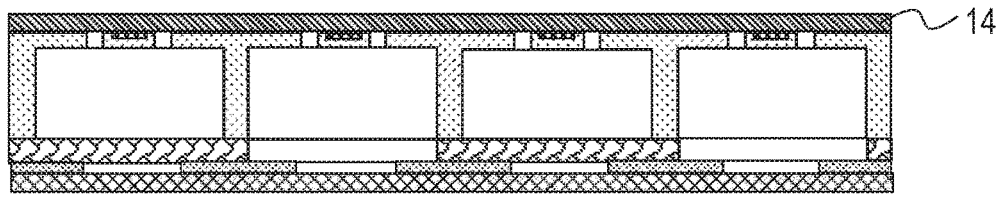
Figure 9L:
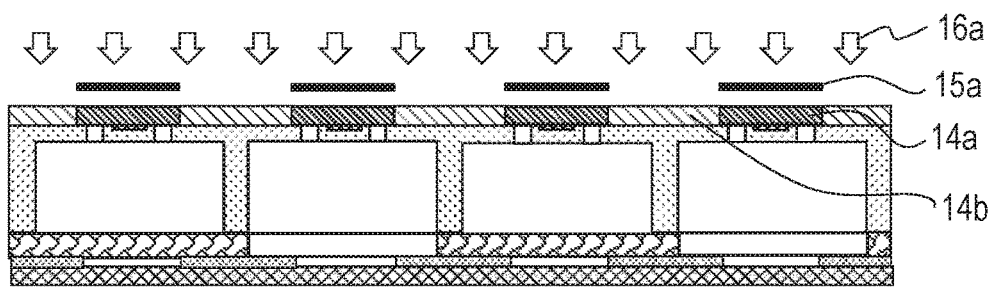
Figure 9M:
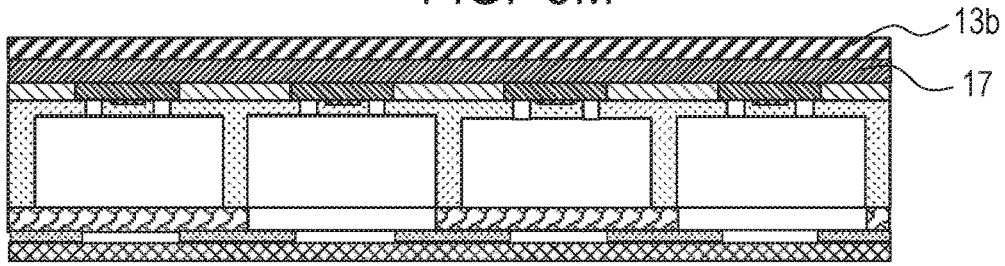
Figure 9N:
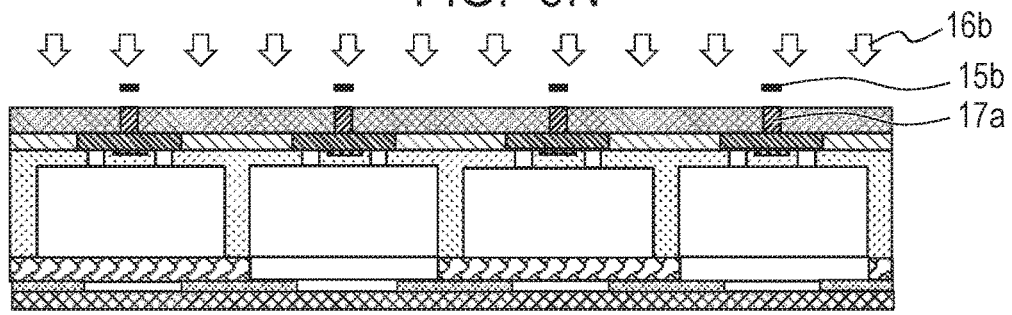
Figure 9O:
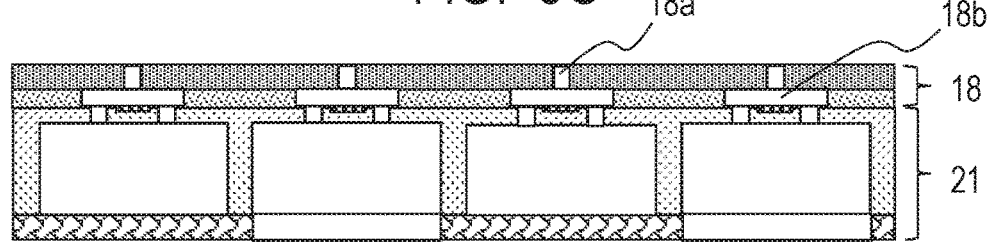

As shown in each of FIGS. 8M, 9O and 10, the liquid ejection head has a nozzle layer 18 and an element substrate 21. In addition, the nozzle layer 18 has a (liquid) ejection orifice 18a for ejecting a liquid, and a (liquid) flow path 18b for communicating with the ejection orifice 18a. Further, the element substrate 21 has an energy generating element 11 for ejecting a liquid from the ejection orifice 18a, and a liquid supply port (reference signs 12a, 12b and 20a) for supplying a liquid to the flow path 18b.

In this regard, FIGS. 8A to 9O are schematic sectional views illustrating each of the steps of the method of producing a liquid ejection head of the present invention, and FIG. 10 is a schematic perspective view of one example of the liquid ejection head obtained by such a production method.

(Nozzle Layer)

The above-described nozzle layer 18 may be a single-layered constitution, or may be a multi-layered constitution as shown in the drawings. For example, the nozzle layer 18 may be constituted of an orifice plate having an ejection orifice 18a, and a flow path wall member having a flow path 18b.

As shown in FIG. 10, the ejection orifice 18a can be formed in an orifice plate part on the upper side of an energy generating element 11, and in general, multiple ejection orifices are formed in one liquid ejection head.

As the material constituting the nozzle layer, it is not particularly limited, and for example, a negative-type photosensitive resin (epoxy resin or the like) can be used, and the material can also be appropriately selected so that the orifice plate and the flow path wall member can be selectively exposed and patterned, respectively. Further, the thickness of the nozzle layer can be appropriately set.

(Element Substrate)

The element substrate 21 may be a single-layered constitution, or may also be a multi-layered structure. For example, as shown in the drawings, the element substrate 21 may be constituted of a substrate 12 having a first liquid supply port (individual liquid supply port) 12a and a second liquid supply port (common liquid supply port) 12b, and a resin layer (liquid supply port member) 20 having a third liquid supply port 20a. In the drawings, a liquid supply port constituted of three parts is described, however, the constitution of the liquid supply port is not limited thereto, and can be appropriately selected. In this regard, as in the through hole 1a in the structure described above, in the liquid supply port, the number of openings on one surface of the element substrate and the number of openings on the surface opposite to the one surface of the element substrate may not be matched with each other. The material of the substrate used for the element substrate 21 is not particularly limited, and for example, silicon, glass, sapphire, and various metals can be appropriately used. In addition, the material constituting the resin layer 20 is not particularly limited, and for example, a negative-type photosensitive resin (epoxy resin or the like) can be used.

The energy generating element 11 may be any energy generating element as long as it can generate energy for ejecting a liquid (for example, a recording liquid such as ink) from an ejection orifice of a liquid ejection head. As the energy generating element 11, for example, an electrothermal conversion element (heater element or the like) for boiling a liquid, or an element (piezo element or the like) for applying a pressure to a liquid by volume change or vibration can be used.

The arrangement of the energy generating element and the liquid supply port can be appropriately set depending on the structure of the liquid ejection head to be prepared.

<Use Method of Liquid Ejection Head>

In a case of recording on a recording medium such as paper by using the liquid ejection head, a surface (ejection orifice surface) on which an ejection orifice of this head has been formed is arranged so as to face a recording surface of the recording medium. Subsequently, a liquid allowed to flow into an element substrate from a (for example, third) liquid supply port and filled in a flow path in a nozzle layer is ejected from an ejection orifice by the energy generated from an energy generating element, and landed on a recording medium, and thus the printing (recording) can be performed.

<Method of Producing Liquid Ejection Head>

The method of producing a liquid ejection head of the present invention is characterized in that at least a part of either one of or both of the above-described nozzle layer 18 and element substrate 21 is prepared by using a dry film resist, and at that time, the above-described method of producing a structure according to the present invention is utilized.

For example, to the preparation of at least one of the above-described resin layer 20, the above-described orifice plate, and the above-described flow path wall member, the above-described method of producing a structure can be applied.

The method of producing a liquid ejection head of the present invention can include, for example, the following steps. In this regard, a surface on the side where a nozzle layer is formed of a substrate is taken as a front surface, and a surface opposite to the front surface of the substrate is taken as a back surface.

A step of preparing a substrate having the above-described energy generating element and at least a part of the above-described liquid supply port (substrate preparation step).

A step of forming a nozzle layer having an ejection orifice and a flow path on a front surface of the substrate (nozzle layer forming step).

A step of forming a resin layer having a part of the above-described liquid supply port on a back surface of the substrate (resin layer forming step).

In addition, the above-described substrate preparation step can include the following steps.

A step of forming an energy generating element on a substrate (element forming step).

A step of forming a through hole (at least a part of the above-described liquid supply port) penetrating the substrate on the substrate (through hole forming step).

Further, the above-described nozzle layer forming step can include the following steps.

A step of forming a flow path wall member having a flow path on a front surface of the obtained substrate (flow path wall member forming step).

A step of forming an orifice plate having an ejection orifice on the front surface of the obtained substrate (orifice plate forming step).

The order of the above-described steps is not particularly limited, and multiple steps may be performed sequentially or may be performed in parallel.

In addition, in the method of producing a liquid ejection head of the present invention, the above-described method of producing a structure according to the present invention can be utilized in the above-described nozzle layer forming step and resin layer forming step.

Hereinafter, each of the steps will be described in detail.

(Substrate Preparation Step)

First, as shown in FIG. 8A, a substrate (through substrate) 12 having an energy generating element (for example, a heater element) 11, and an individual liquid supply port (first liquid supply port) 12a and a common liquid supply port (second liquid supply port) 12b, which penetrate a surface of the substrate in a substantially perpendicular direction, is prepared.

Specifically, on a substrate, an energy generating element 11, a protective film (not shown) for protecting the element, and the like are formed by a multilayer wiring technique using, for example, photolithography (element forming step).

Next, in the substrate, the liquid supply ports are formed by using a processing method such as dry etching (for example, reactive ion etching (RIE)) or wet etching (through hole forming step). In FIGS. 8A to 8G, a liquid supply port having a structure in which two individual liquid supply ports placed on both sides of the energy generating element 11 are communicated with one common liquid supply port is described, however, the constitution of the liquid supply port is not limited thereto, and may be appropriately set.

In the following description, an example in which the nozzle layer forming step is performed before the resin layer forming step will be described, however, the order of these steps is not particularly limited.

(Nozzle Layer Forming Step)

First, as shown in FIG. 8B, onto a support member (for example, a PET film) 13a, a first photosensitive resin (for example, an epoxy resin) is applied, for example, by a slit coating method or the like to form a first resin layer 14, and a first dry film resist (DFR) is obtained.

Next, as shown in FIG. 8C, on a front surface (surface on the upper side of the drawing sheet) of a through substrate 12, a first DFR having a first resin layer 14 and a support member 13a in this order is formed into a film, for example, by lamination. The conditions of the lamination can be appropriately set depending on the material to be used for the DFR, and the adhesion to the through substrate can be further enhanced by heating at around 30 to 120° C. and pressing with a roller or the like. After that, the support member 13a is peeled off from the first resin layer 14.

In this case, the DFR is formed into a film on the through substrate 12 without protecting a back surface (surface on the lower side of the drawing sheet) of the through substrate. If necessary, the lamination of the first DFR and the peeling of the support member can be performed in a state of protecting the back surface of the through substrate 12 with the above-described protective member of the present invention.

Next, as shown in FIG. 8D, the first resin layer 14 is exposed 16a through a mask 15a, post exposure baking (PEB) is performed as necessary, and latent images of an unexposed part 14a corresponding to a flow path and an exposed part 14b are formed.

Next, separately, a second DFR having a second resin layer (for example, an epoxy resin layer) 17 is prepared on a support member (for example, a PET film) 13b. Subsequently, as shown in FIG. 8E, the second DFR having the second resin layer 17 and the support member 13b in this order is formed into a film on the first resin layer, for example, by lamination, and then the support member 13b is peeled off from the second resin layer 17. The conditions of the lamination can be appropriately set as described above. In this regard, since the patterning of the second resin layer is performed in a state that two resin layers (the first resin layer 14 and the second resin layer 17) are placed, the sensitivity of the second resin layer to light is preferably three times or more the sensitivity of the first resin layer to light. For this reason, it is preferred to select resin materials that satisfy such conditions, respectively. In this case, an example of using a negative-type photosensitive resin as each of the first and second photosensitive resins is described.

Further, if necessary, the lamination of the second DFR and the peeling of the support member can be performed in a state of protecting a back surface of the through substrate 12 with the above-described protective member of the present invention.

Next, as shown in FIG. 8F, the second resin layer 17 is exposed 16b through a mask 15b, PEB is performed as necessary, and latent images of an unexposed part 17a corresponding to an ejection orifice and an exposed part 17b are formed.

Next, as shown in FIG. 8G, the unexposed parts 14a and 17a are subjected to development by using a developer (for example, propylene glycol 1-monomethyl ether 2-acetate (PGMEA)) or the like, and the resultant parts are thermally cured as necessary. In this way, a nozzle layer 18 having an ejection orifice 18a and a flow path 18b can be formed.

(Resin Layer Forming Step)

Next, as shown in FIGS. 8H and 8I, a separately prepared protective member 2 is stuck onto a surface (ejection orifice surface) on which an ejection orifice 18a of a nozzle layer is formed. In this cases, as the protective member 2, a protective member having an atmosphere communication layer 4 including an adhesive part 4b as shown in FIG. 6A and a protective layer 3 is used, however, the above-described various protective members can be appropriately used. The position of sticking the protective member can be appropriately set within the range that the effects of the present invention can be exerted, and it is preferred to stick the protective member in an arrangement for satisfying the area range described above in the method of producing a structure.

Next, separately, a third DFR having a third resin layer (for example, an epoxy resin layer) 19 is prepared on a support member (for example, a PET film) 13c. Further, in this case, a negative-type photosensitive resin is used as the third resin layer. Subsequently, as shown in FIG. 8J, on a surface on which a common liquid supply port 12b has been formed, a third DFR having a third resin layer 19 and a support member 13c in this order is formed into a film, for example, by lamination. After that, as shown in FIG. 8K, the support member 13c is peeled off from the third resin layer 19.

In the present invention, since a protective member 2 having a specific structure is used, also when a support member is peeled off, the deformation of the third resin layer 19 can be prevented.

Next, as shown in FIG. 8L, the third resin layer 19 is exposed 16c through a mask 15c, PEB is performed as necessary, and latent images of an unexposed part 19a corresponding to a third liquid supply port and an exposed part 19b are formed. In the present invention, even in a case where vacuum suction by a device is utilized for this exposure, since a protective member 2 having a specific structure is used, the liquid supply port part can be prevented from becoming in a reduced pressure state. For this reason, when a support member is peeled off, the deformation of the third resin layer 19 can be prevented.

Next, as shown in FIG. 8M, the protective member 2 is peeled off by appropriately using a peeling device, PEB is performed as necessary, and then development is performed by using a developer or the like, and thermal curing or the like is performed to form a resin layer 20 having a third liquid supply port 20a.

Further, by electrically bonding an electric wiring member for driving an energy generating element to the obtained substrate, if necessary, a liquid ejection head can be obtained.

EXAMPLES

Hereinafter, the present invention will be described in more detail by way of examples. In these examples, as a structure, a liquid ejection head is prepared, however, the application of the method of producing a structure according to the present invention is not limited thereto.

In the following Example 1, an example in which a nozzle layer having an ejection orifice and a flow path is formed at the beginning, an ejection orifice surface of the nozzle layer is protected with the protective member of the present invention, and then a resin layer having a third liquid supply port is formed is shown. Further, in the following Example 2, an example in which at first, on a through substrate on which an energy generating element and first and second liquid supply ports have been placed, a resin layer having a third liquid supply port is formed after a surface on which the element has been formed is protected with the protective member of the present invention, after that, further, an opening surface of the resin layer is protected with the protective member of the present invention, and then a nozzle layer having an ejection orifice and a flow path is formed is shown.

However, the surface on which and the timing at which the protective member (protective tape) of the present invention is stuck are not limited by these Examples, and in order to prevent the resin layer deformation due to pressure fluctuations in a through hole (liquid supply port in these examples) part of a substrate, the protective member can be appropriately used.

Example 1

As shown in FIG. 8A, a substrate made of silicon, on which an energy generating element (heater element) 11 formed by a multilayer wiring technique using photolithography had been placed, was prepared. Subsequently, on this substrate, an individual liquid supply port 12a and a common liquid supply port 12a were formed by a RIE method using a Bosch process to obtain a through substrate 12.

Next, as shown in FIG. 8B, onto a PET film (trade name: LUMIRROR T60, manufactured by Toray Industries, Inc.) as a support member 13a, a coating liquid containing an epoxy resin (trade name: N-695, manufactured by Dainippon Ink and Chemicals, Incorporated) was applied by a slit coating method to form a first resin layer 14, and a first DFR was obtained. In the formation of the first resin layer, a coating liquid (first resin composition) in which the above-described epoxy resin and a photoinitiator (trade name: CPI-210S, manufactured by San-Apro Ltd.) having sensitivity at an exposure wavelength of 365 nm had been dissolved in a solvent (PGMEA) was used. the amount of the photoinitiator to be added was adjusted so that the first resin layer and a second resin layer to be described later were selectively exposed and patterned when forming an ejection orifice in the second resin layer. In this regard, the thickness of the first resin layer 14 was 16 µm.

Next, as shown in FIG. 8C, the obtained first DFR and the through substrate 12 were bonded to each other by a roll-type laminator (trade name: VTM-200, manufactured by Takatori Corporation) so that the first resin layer 14 was placed on a front surface (surface on the upper side of the drawing sheet) of the through substrate. In the present Example, the lamination was performed under conditions of a temperature of 90° C. and a pressure of 0.4 MPa so that the thickness of the first resin layer 14 on the through substrate 12 was 15 µm. After that, the support member 13a was peeled off from the first resin layer 14 at room temperature (a temperature of 23° C.).

Next, as shown in FIG. 8D, by an exposure machine (not shown, trade name: FPA-3000i5+, manufactured by Canon Inc.), the first resin layer 14 was subjected to pattern exposure with light 16a having an exposure wavelength of 365 nm at an exposure amount of 5000 J/m² through a mask 15a. After that, PEB was performed at 50° C. for 5 minutes, and a latent image was formed so that the unexposed part 14a of the first resin layer 14 became a flow path.

Next, separately, onto a PET film (trade name: LUMIRROR T60, manufactured by Toray Industries, Inc.) as a support member 13b, a coating liquid containing an epoxy resin (trade name: 157S70, manufactured by Japan Epoxy Resin Co., Ltd.) was applied by a slit coating method to form a second resin layer 17, and a second DFR was obtained. In the formation of the second resin layer, a coating liquid (second resin composition) in which the above-described epoxy resin and a photoinitiator (trade name: LW-S1, manufactured by San-Apro Ltd.) having sensitivity at an exposure wavelength of 365 nm had been dissolved in a solvent (PGMEA) was used.

Subsequently, as shown in FIG. 8E, the obtained second DFR and the first resin layer were bonded to each other by the above-described roll-type laminator so that the second resin layer 17 was placed on a front surface of the first resin layer.

At this time, as already described, it is preferred to provide a difference in sensitivity with respect to the second resin layer so that the unexposed part 14a of the flow path pattern formed with the first resin layer is not exposed. The sensitivity of the first resin layer 14 to light is preferably lower than the sensitivity of the second resin layer 17 to light. As a result of keen studies, when the sensitivity of the first resin layer 14 to light is taken as 1, the sensitivity of the second resin layer 17 to light is preferably 3 or more.

Next, as shown in FIG. 8F, by an exposure machine (trade name: FPA-3000i5+, manufactured by Canon Inc.), the second resin layer 17 was subjected to pattern exposure with light 16b having an exposure wavelength of 365 nm at an exposure amount of 1000 J/m$^2$ through a mask 15b. After that, PEB was performed at 90° C. for 4 minutes, and a latent image was formed so that the unexposed part 17a of the second resin layer 17 became an ejection orifice.

Next, by immersing the obtained substrate in PGMEA being a developer, the unexposed parts 14a and 17a were removed at the same time as shown in FIG. 8G, curing was performed at 200° C. for 1 hour, and a nozzle layer 18 having an ejection orifice 18a and a flow path 18b was formed.

Next, as shown in FIGS. 8H and 8I, a protective member 2 was stuck onto a surface on which an ejection orifice 18a had been formed. In the present Example, a PET film (trade name: LUMIRROR T60, manufactured by Toray Industries, Inc.) having a thickness of 75 μm was used as a protective layer 3 (base material). Subsequently, on the protective layer 3, an acrylic pressure-sensitive adhesive (trade name: SK-DYNE 1473H, manufactured by Soken Chemical & Engineering Co., Ltd.) was pattern-coated as an atmosphere communication layer 4 to form an adhesive part 4b having a thickness (average depth of recess (groove)) of 10 μm. That is, in the present Example, a protective member 2 shown in each of FIGS. 2A and 6A was used. In this regard, the average width of the recess in the protective member was set to 5 mm.

In the present Example, in the sticking, the sticking was performed so that ejection orifices corresponding to 10% or more of the total opening area of multiple ejection orifices on the ejection orifice surface among the multiple ejection orifices 18a constituting the same through hole space were communicated with outside air via the protective member 2. In this regard, in the present Example, all of the through holes having different through hole spaces (each through hole constituted of an ejection orifice, a flow path, an individual liquid supply port, and a common liquid supply port) were communicated with atmosphere via the protective member. Further, at this time, 95% of the area (including the opening area of the ejection orifice) of the ejection orifice surface was in contact with the protective member 2.

Next, separately, onto a PET film (trade name: LUMIRROR S10, manufactured by Toray Industries, Inc.) as a support member 13c, an epoxy resin (trade name: TMMF manufactured by TOKYO OHKA KOGYO CO., LTD.) was applied to form a third resin layer 19 having a thickness of 20 μm, and a third DFR was obtained. Subsequently, as shown in FIG. 8J, the obtained third DFR was bonded onto a surface on which a common liquid supply port 12b of a through substrate had been formed by a roll-type laminator (trade name: VTM-200, manufactured by Takatori Corporation). At that time, the lamination was performed at a stage temperature and a roller temperature of 40° C., a roller pressure of 0.2 MPa, and a roller speed of 10 mm/s.

Next, as shown in FIG. 8K, the PET film as the support member 13c was peeled off from the third resin layer 19. At this time, when the surface shape of the third resin layer 19 was observed with VertScan (trade name, manufactured by Ryoka Systems Inc.), the deformation of the resin layer was not observed.

Next, as shown in FIG. 8L, by an exposure machine (projection exposure device, manufactured by USHIO INC.), the third resin layer 19 was subjected to irradiation to perform pattern exposure with light 16c having an exposure wavelength of 365 nm at an exposure amount of 400 mJ/m$^2$ as the first exposure through a mask 15a. At this time, the substrate on which the third resin layer had been placed was vacuum-sucked by a device such that the opening size was not affected by the warp of the substrate, and the deformation of the third resin layer 19 was not observed.

Next, as shown in FIG. 8M, the protective member 2 was peeled off by a peeling device (manufactured by Takatori Corporation), PEB was performed, and then the development was performed by using a developer (PGMEA). After that, again, the entire surface of the substrate having the third resin layer was subjected to irradiation at an exposure amount of 2000 mJ/cm$^2$ as the second exposure by an i-line exposure machine, curing was performed at 200° C. for 1 hour, and a resin layer 20 having a third liquid supply port 20a was formed. Electric bonding (not shown) of an electric wiring member for driving a heater element was performed to the obtained substrate, and a liquid ejection head was obtained.

Example 2

In a similar manner as in Example 1, as shown in FIG. 9A, a substrate made of silicon (through substrate) 12 having an energy generating element (heater element) 11, an individual liquid supply port 12a, and a common liquid supply port 12b was prepared.

In this regard, a surface on which the energy generating element had been formed (surface on the upper side of the drawing sheet shown in FIG. 9A) of the through substrate 12 is taken as a front surface, and a surface opposite to the front surface is taken as a back surface.

Next, as shown in FIGS. 9B and 9C, a protective member 2 was stuck onto a front surface of the through substrate 12. In the present Example, a PET film (trade name: LUMIRROR T60, manufactured by Toray Industries, Inc.) having a thickness of 75 μm was used as a protective layer 3 (base material). Subsequently, on the protective layer 3, an acrylic pressure-sensitive adhesive (trade name: SK-DYNE 1473H, manufactured by Soken Chemical & Engineering Co., Ltd.) was pattern-coated as an atmosphere communication layer 4 to form an adhesive part 4b having a thickness (average depth of recess (groove) 4a) of 10 μm. That is, in the present Example, a protective member 2 shown in each of FIGS. 2A and 6A was used. In this regard, the average width of the recess in the protective member was set to 5 mm. In the present Example, the sticking was performed so that individual liquid supply ports 12a corresponding to 10% or more of the total opening area of multiple individual liquid supply ports on a front surface of the through substrate 12 among the multiple individual liquid supply ports 12a constituting the same through hole space were communicated with outside air via the protective member 2. In this regard, in the present Example, all of the through holes having different through hole spaces (each through hole constituted of an individual liquid supply port, and a common liquid supply port) were communicated with atmosphere via the protective member. Further, at that time, 75% of the area (including the opening area of the individual liquid supply port) of the front surface of the through substrate was in contact with the protective member 2.

Next, separately, a third DFR having a support member 13c and a third resin layer 19, which was similar to that used in FIG. 8J, was prepared. Subsequently, as shown in FIG. 9D, the third DFR was bonded onto a back surface of the through substrate so that the third resin layer 19 was in contact with the back surface by a roll-type laminator (trade name: VTM-200, manufactured by Takatori Corporation). At that time, the lamination was performed at a stage temperature and a roller temperature of 40° C., a roller pressure of 0.2 MPa, and a roller speed of 10 mm/s.

Next, as shown in FIG. 9E, the PET film as the support member 13c was peeled off from the third resin layer 19. At this time, when the surface shape of the third resin layer 19 was observed with VertScan (trade name, manufactured by Ryoka Systems Inc.), the deformation of the resin layer was not observed.

Next, as shown in FIG. 9F, by an exposure machine (projection exposure device, manufactured by USHIO INC.), the third resin layer 19 was subjected to pattern exposure with light 16c having an exposure wavelength of 365 nm at an exposure amount of 400 mJ/m$^2$ as the first exposure through a mask 15c. At this time, the substrate on which the third resin layer had been placed was vacuum-sucked by a device such that the opening size was not affected by the warp of the substrate, and the deformation of the third resin layer 19 was not observed.

Next, as shown in FIG. 9G, the protective member 2 was peeled off by a peeling device (manufactured by Takatori Corporation), PEB was performed, and then the development was performed by using a developer (PGMEA). After that, again, the entire surface of the substrate having the third resin layer was subjected to irradiation at an exposure amount of 2000 mJ/cm$^2$ as the second exposure by an i-line exposure machine, curing was performed at 200° C. for 1 hour, and a resin layer 20 having a third liquid supply port 20a was formed.

Next, as shown in FIGS. 9H and 9I, a protective member 2 that was similar to that used in FIG. 9B was stuck on a surface on which a resin layer 20 had been formed (surface opposite to a front surface of a through substrate). In the present Example, the sticking was performed so that third liquid supply ports 20a corresponding to 30% of the total opening area of multiple third liquid supply ports on a surface on which the resin layer 20 had been formed among the multiple third liquid supply ports 20a constituting the same through hole space were communicated with outside air via the protective member 2. In this regard, all of the through holes having different through hole spaces (each through hole constituted of first to third liquid supply ports) were communicated with atmosphere via the protective member. In addition, in the sticking, 65% of the area (including the opening area of the third liquid supply port) of a surface on which the resin layer 20 had been formed was in contact with the protective member 2.

Next, separately, a first DFR having a support member 13a and a first resin layer 14, which was similar to that used in FIG. 8B, was prepared. Subsequently, as shown in FIG. 9J, the first DFR was bonded onto a front surface (surface on the upper side of the drawing sheet shown in FIG. 9I) of the through substrate 12 so that the first resin layer 14 was in contact with the front surface by a roll-type laminator (trade name: VTM-200, manufactured by Takatori Corporation). At that time, the lamination was performed under conditions of a temperature of 90° C. and a pressure of 0.4 MPa so that the thickness of the first resin layer 14 on the through substrate 12 was 15 μm. After that, as shown in FIG. 9K, the support member 13a was peeled off at room temperature (a temperature of 23° C.). At this time, when the surface shape of the first resin layer 14 was observed with VertScan (trade name, manufactured by Ryoka Systems Inc.), the deformation of the resin layer was not observed.

Next, as shown in FIG. 9L, by an exposure machine (trade name: FPA-3000i5+, manufactured by Canon Inc.), the first resin layer 14 was subjected to pattern exposure with light 16a having an exposure wavelength of 365 nm at an exposure amount of 5000 J/m$^2$ through a mask 15a. After that, PEB was performed at 50° C. for 5 minutes, and a latent image was formed so that the unexposed part 14a of the first resin layer 14 became a flow path.

Next, separately, a second DFR having a support member 13b and a second resin layer 17, which was similar to that used in FIG. 8E, was prepared. Subsequently, as shown in FIG. 9M, the second DFR was bonded onto a front surface of the first resin layer so that the second resin layer 17 was in contact with the front surface by a roll-type laminator (trade name: VTM-200, manufactured by Takatori Corporation).

Next, as shown in FIG. 9N, by an exposure machine (trade name: FPA-3000i5+, manufactured by Canon Inc.), the second resin layer 17 was subjected to pattern exposure with light 16b having an exposure wavelength of 365 nm at an exposure amount of 1000 J/m$^2$ through a mask 15b. After that, PEB was performed at 90° C. for 4 minutes, and a latent image was formed so that the unexposed part 17a of the second resin layer 17 became an ejection orifice.

Next, as shown in FIG. 9O, the protective member 2 was peeled off by a peeling device (manufactured by Takatori Corporation), and further, the obtained substrate was immersed in a developer (PGMEA). In this way, the unexposed parts 14a and 17a were removed at the same time, and a nozzle layer 18 having an ejection orifice 18a and a flow path 18b was formed.

Subsequently, curing was performed at 200° C. for 1 hour, and further, electric bonding (not shown) of an electric wiring member for driving a heater element was performed to the obtained substrate, and a liquid ejection head was obtained.

As shown in these Examples, in a method of producing a structure (liquid ejection head) having a through substrate, in a state of protecting one surface of the through substrate and the like with the protective member of the present invention, a DFR requiring peeling of a support member was used in processing the other surface. As a result, also in the peeling of a support member, the suction operation using a device, or the like, a favorable liquid ejection head can be formed without generating large deformation in the DFR.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-005089, filed Jan. 16, 2018, which is hereby incorporated by reference herein in its entirety.

What is claimed is:

1. A method of producing a structure having:
   a through substrate having a first surface and a second surface opposite to the first surface, and having a through hole penetrating the through substrate from the first surface to the second surface; and
   a resin layer placed on the first surface of the through substrate,
   the method comprising:
   forming a protective member having an atmosphere communication layer having a structure communicating with the through hole by permeation from at least a part of a layer side surface part to the through hole, and a gas-impermeable protective layer in this order, on the second surface of the through substrate;
   forming a dry film resist layer having the resin layer and a support member in this order, on the first surface of the through substrate; and
   peeling the support member from the resin layer,
   wherein the support member is peeled from the resin layer in a state that the through hole of the through substrate is communicated with atmosphere by at least the atmosphere communication layer, in the peeling.

2. The method according to claim 1, wherein the protective member has a recess communicating with the through hole, and the recess is communicated with atmosphere.

3. The method according to claim 2, wherein the recess penetrates at least a part of the atmosphere communication layer in a thickness direction of the atmosphere communication layer, and a bottom is provided in an inner part of the atmosphere communication layer, on a surface of the protective layer, or in an inner part of the protective layer.

4. The method according to claim 2, wherein a width of the recess is 500 times or less relative to a depth of the recess, and the depth of the recess is 1 μm to 1 mm.

5. The method according to claim 1, wherein the atmosphere communication layer includes an adhesive part on a second surface side of the through substrate.

6. The method according to claim 1, wherein the atmosphere communication layer includes a photosensitive resin layer.

7. The method according to claim 1, wherein the atmosphere communication layer has an adhesive part and a gas-permeable layer in this order on the second surface.

8. The method according to claim 1, wherein the through substrate has a plurality of through holes, and the peeling is performed in a state that all of the through holes are communicated with atmosphere via the protective member.

9. The method according to claim 1, wherein the peeling is performed in a state that 10% or more of an opening area of the through hole at the second surface of the through substrate is communicated with atmosphere via the protective member.

10. The method according to claim 1, wherein the peeling is performed in a state that 25% or more of an area of the second surface of the through substrate is in contact with the protective member.

11. The method according to claim 1, wherein the resin layer includes a photosensitive resin.

12. The method according to claim 1, further comprising patterning the resin layer.

13. The method according to claim 1, further comprising removing at least the protective layer of the protective member from the second surface of the through substrate.

14. A protective substrate, comprising:
   a through substrate having a first surface and a second surface opposite to the first surface, and having a through hole penetrating the through substrate from the first surface to the second surface;
   a dry film resist layer being placed on the first surface of the through substrate, and having a resin layer and a support member in this order on the first surface; and
   a protective member being placed on the second surface of the through substrate,
   wherein the protective member has an atmosphere communication layer having a structure communicating with the through hole by permeation from at least a part of a layer side surface part to the through hole, and a gas-impermeable protective layer in this order, on the second surface, and
   wherein the through hole of the through substrate communicates with atmosphere by at least the atmosphere communication layer.

15. A method of producing a protective substrate having:
   a through substrate having a first surface and a second surface opposite to the first surface, and having a through hole penetrating the through substrate from the first surface to the second surface;
   a dry film resist layer being placed on the first surface of the through substrate, and having a resin layer and a support member in this order on the first surface; and
   a protective member being placed on the second surface of the through substrate, and having an atmosphere communication layer having a structure communicating with the through hole by permeation from at least a part of a layer side surface part to the through hole, and a gas-impermeable protective layer in this order, on the second surface,
   the method comprising:
   forming the protective member on the second surface of the through substrate; and
   forming the dry film resist layer on the first surface of the through substrate,
   wherein the protective member is formed on the second surface of the through substrate in an arrangement that the through hole of the through substrate is communicated with atmosphere by at least the atmosphere communication layer, in the forming of the protective member.

* * * * *